United States Patent [19]

Shirota

[11] Patent Number: 5,162,795
[45] Date of Patent: Nov. 10, 1992

[54] CODING AND DECODING APPARATUS OF VARIABLE LENGTH DATA

[75] Inventor: Norihisa Shirota, Kanagawa, Japan

[73] Assignee: Sony Corporation, Tokyo, Japan

[21] Appl. No.: 674,926

[22] Filed: Mar. 26, 1991

[30] Foreign Application Priority Data

Mar. 28, 1990 [JP] Japan .................................. 2-80492

[51] Int. Cl.⁵ .................................................. H03M 7/40
[52] U.S. Cl. ............................................. 341/67; 341/61
[58] Field of Search .......................... 341/67, 95, 61

[56] References Cited

U.S. PATENT DOCUMENTS

| | | | |
|---|---|---|---|
| 4,177,456 | 12/1979 | Fukinuki et al. | 341/67 |
| 4,441,183 | 4/1984 | Dussault | 371/25 |
| 4,593,267 | 6/1986 | Kuroda et al. | 341/67 |
| 4,963,867 | 10/1990 | Bertrand | 341/67 |
| 5,055,841 | 10/1991 | Cordell | 341/67 |

FOREIGN PATENT DOCUMENTS

| | | |
|---|---|---|
| 3404436 | 8/1984 | Fed. Rep. of Germany . |
| 3632682 | 3/1988 | Fed. Rep. of Germany . |
| 3406624 | 5/1989 | Fed. Rep. of Germany . |
| 3736898 | 5/1989 | Fed. Rep. of Germany . |

*Primary Examiner*—Marc Hoff
*Attorney, Agent, or Firm*—Alvin Sinderbrand; William S. Frommer

[57] ABSTRACT

An apparatus for encoding variable bit length data words into constant bit length data words concatenates the variable length data words supplied at a first data rate so as to output constant length data words at a second data rate. An apparatus for decoding constant bit length data words into variable bit length data words shifts and concatenates the constant bit length data words, determines when a variable length data word is present in the concatenated data, supplies information about the number of bits in the variable length data words which is used when shifting the next constant bit length data word, and outputs variable bit length data words.

5 Claims, 31 Drawing Sheets

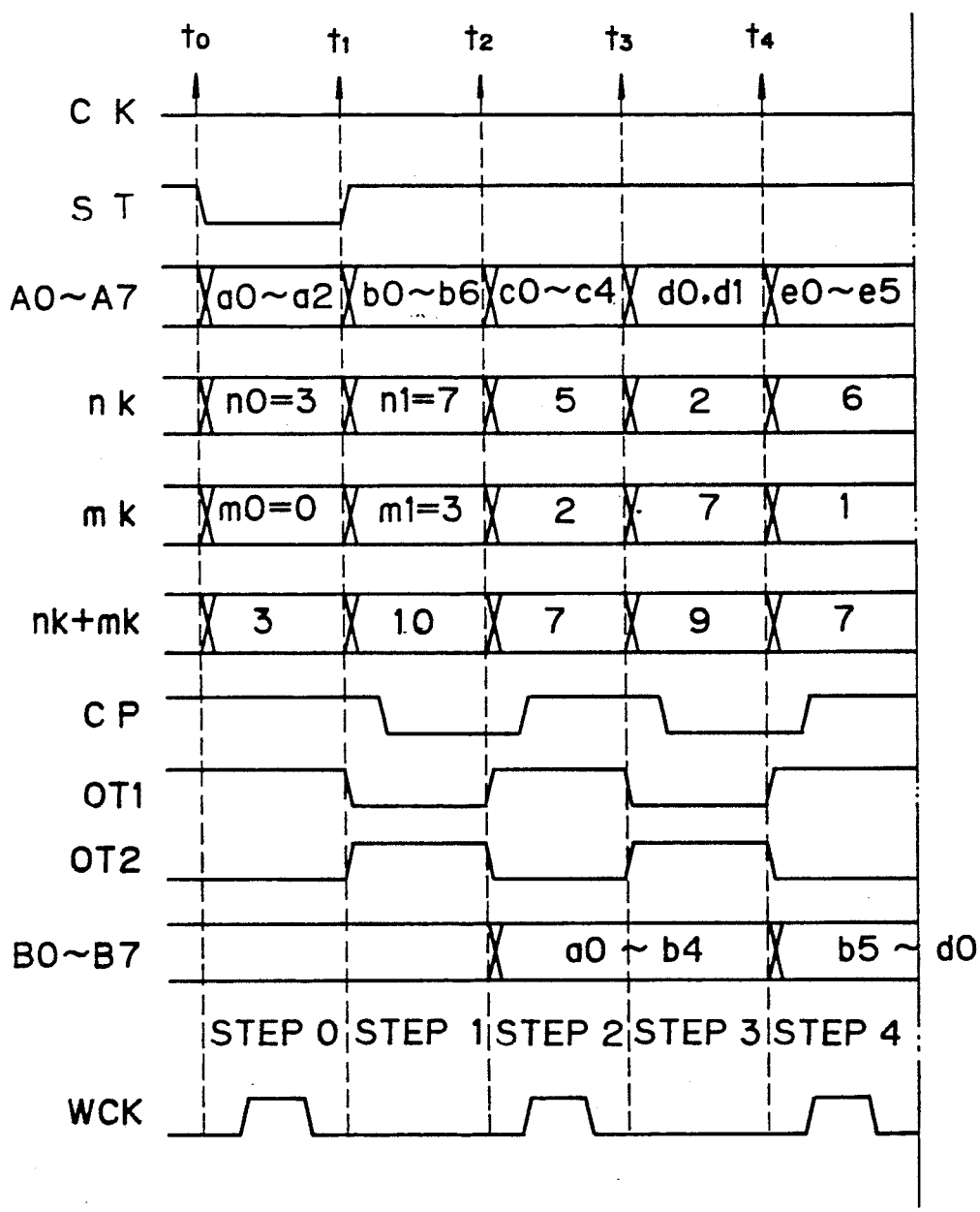

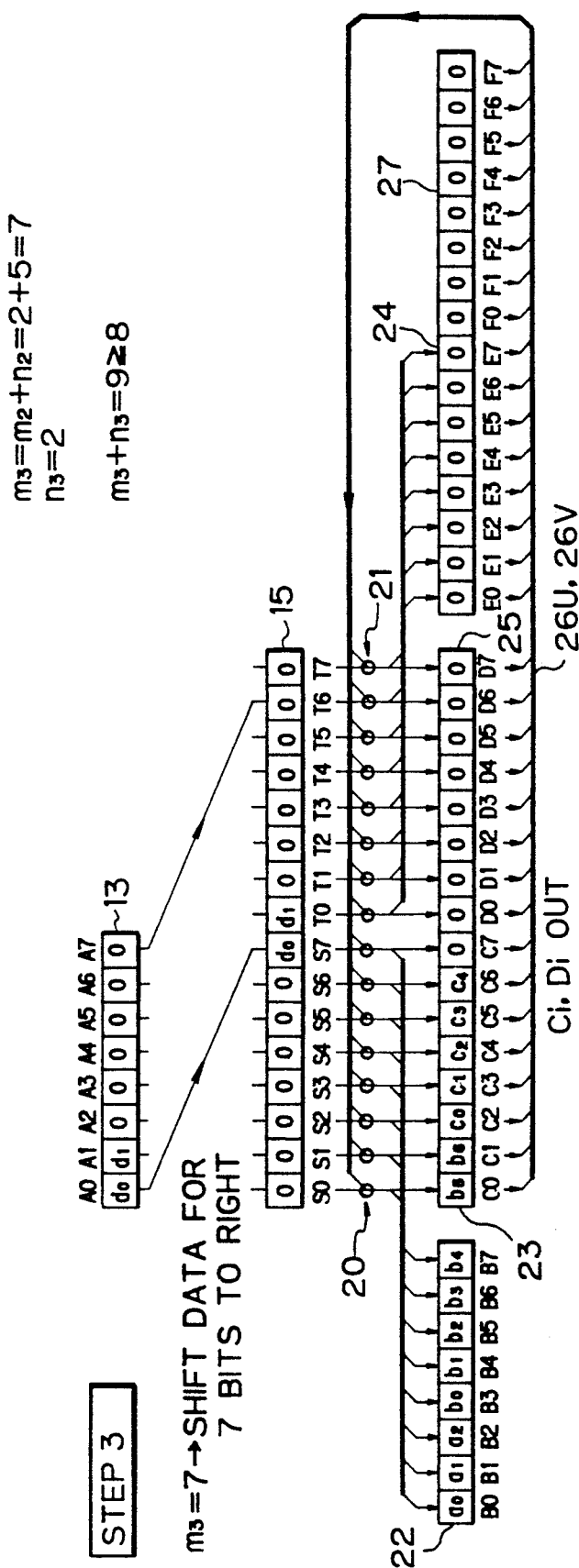

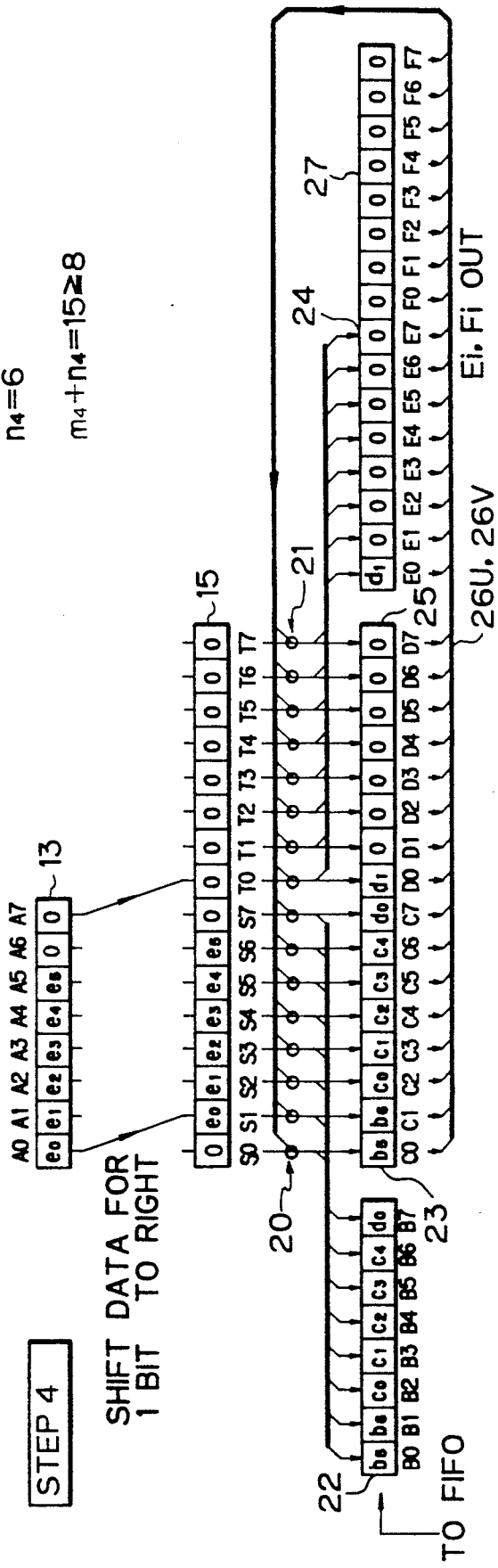

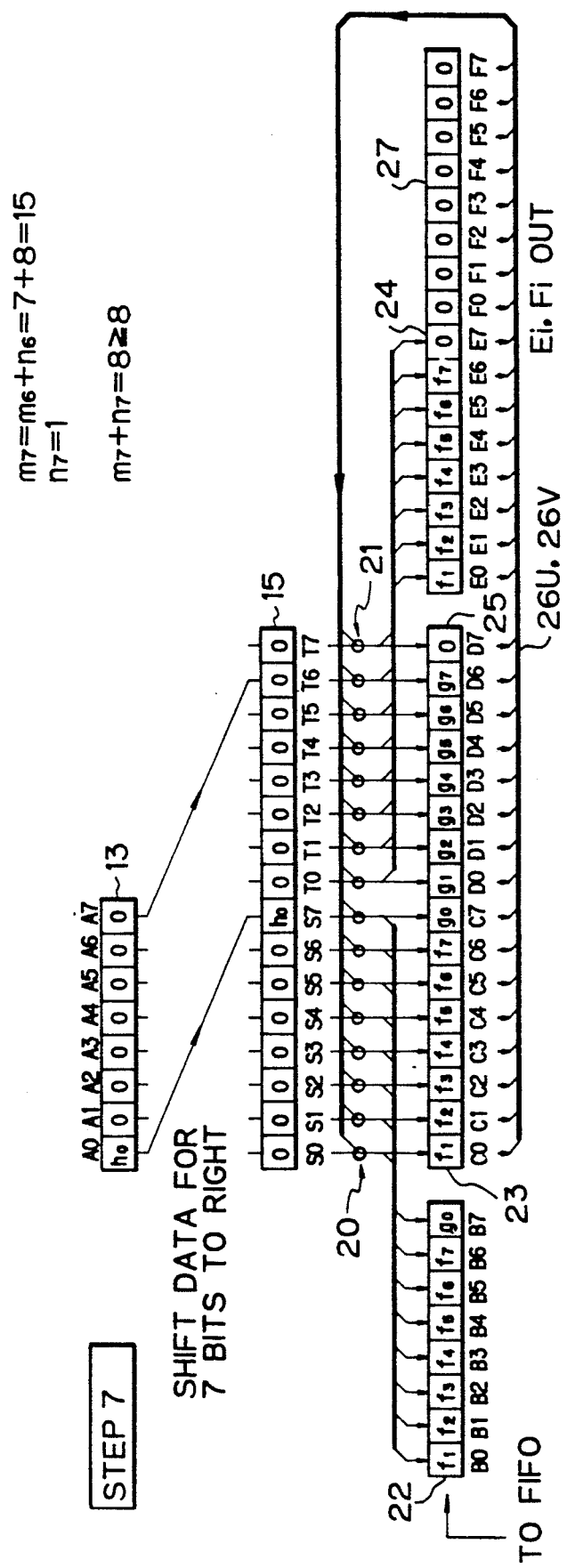

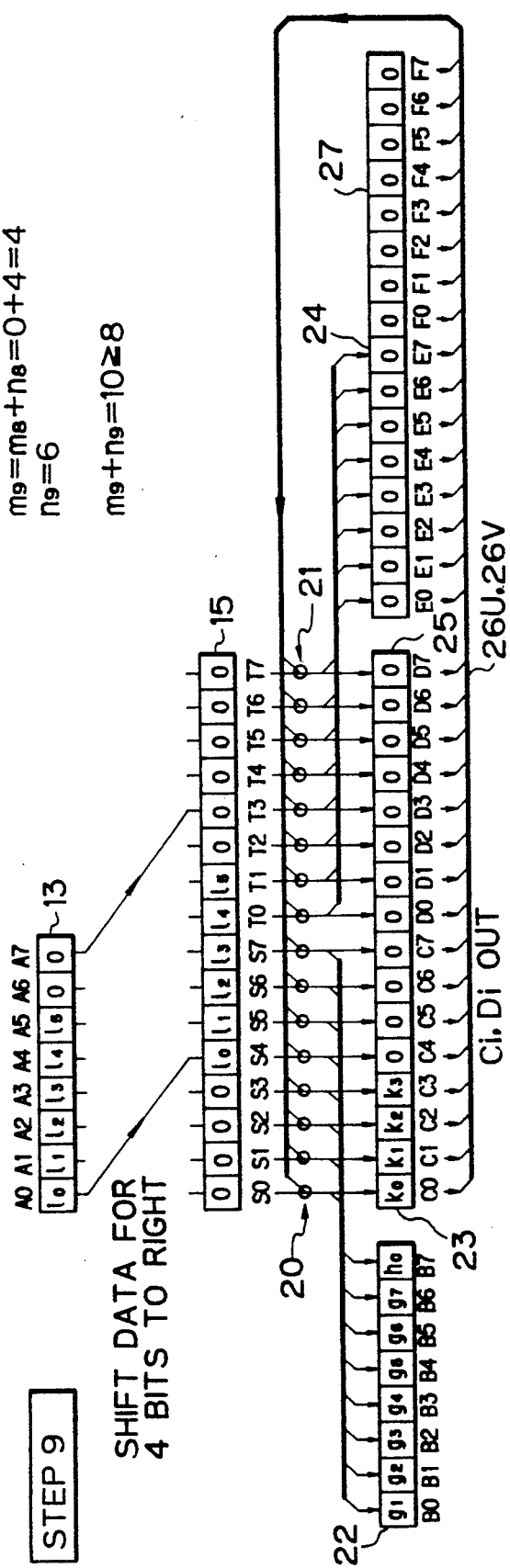

Fig. 6

| ←── | 1 WORD (8 BITS) | ──→ | | | | | | |
|---|---|---|---|---|---|---|---|---|
| a0 | a1 | a2 | b0 | b1 | b2 | b3 | b4 | t0 |
| b5 | b6 | c0 | c1 | c2 | c3 | c4 | d0 | t1 |
| d1 | e0 | e1 | e2 | e3 | e4 | e5 | f0 | t2 |
| f1 | f2 | f3 | f4 | f5 | f6 | f7 | g0 | t3 |
| g1 | g2 | g3 | g4 | g5 | g6 | g7 | h0 | t5 |
| k0 | k1 | k2 | k3 | l0 | l1 | l2 | l3 | t7 |
| l4 | l5 | p0 | p1 | q0 | r0 | r1 | r2 | t8 |
| x0 | x1 | y0 | z0 | z1 | z2 | z3 | z4 | t9 |
| z5 | w0 | w1 | w2 | w3 | u0 | u1 | u2 | t11 |
| u3 | u4 | u5 | — | — | — | — | — | |

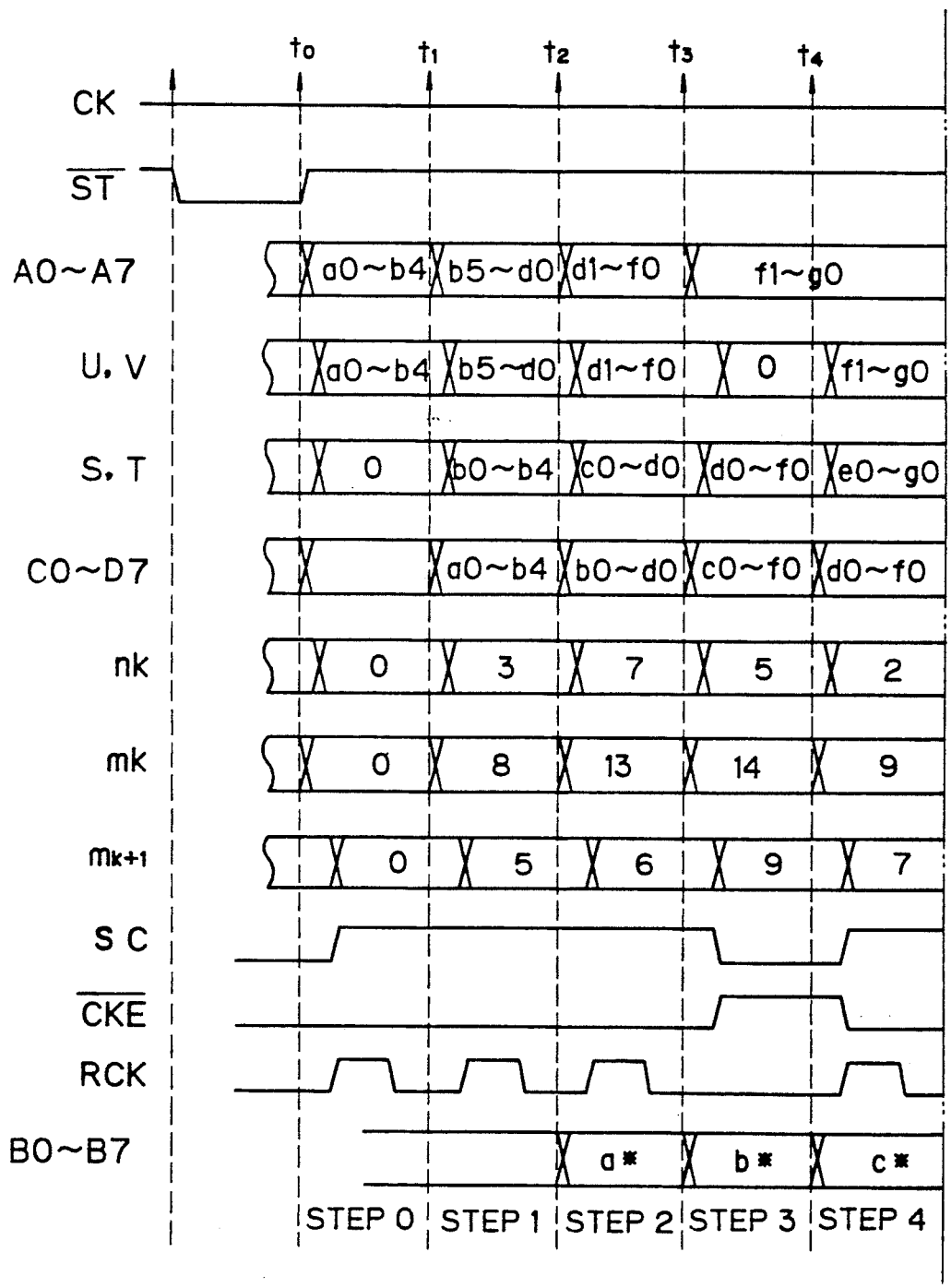

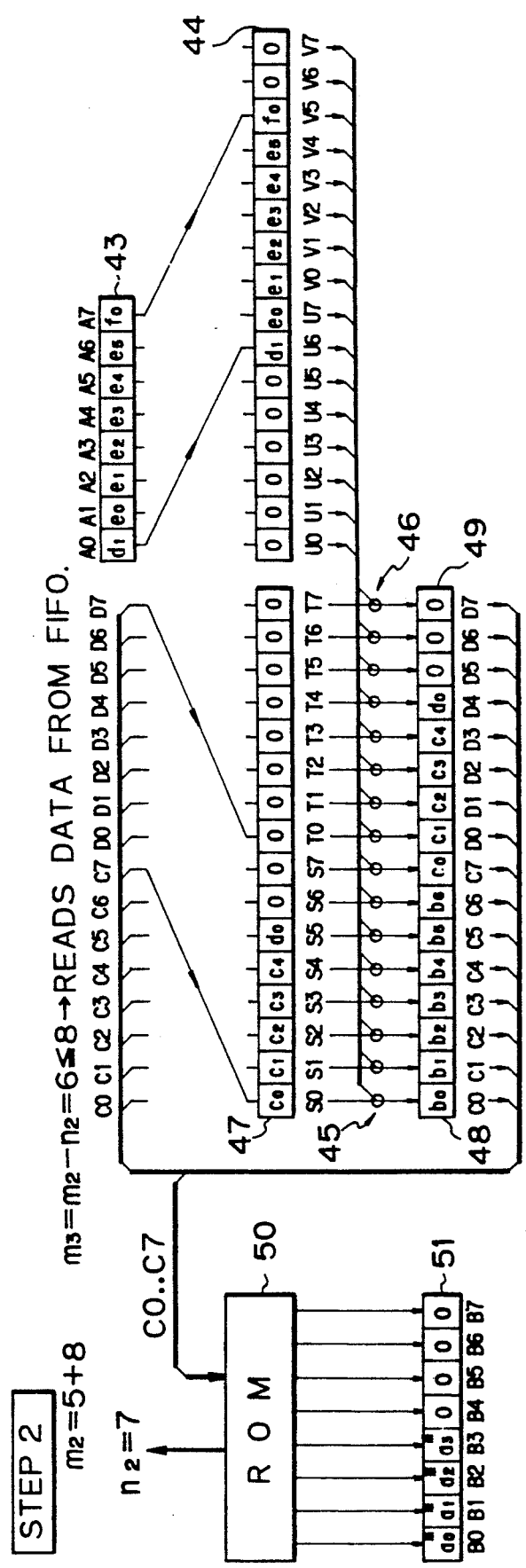

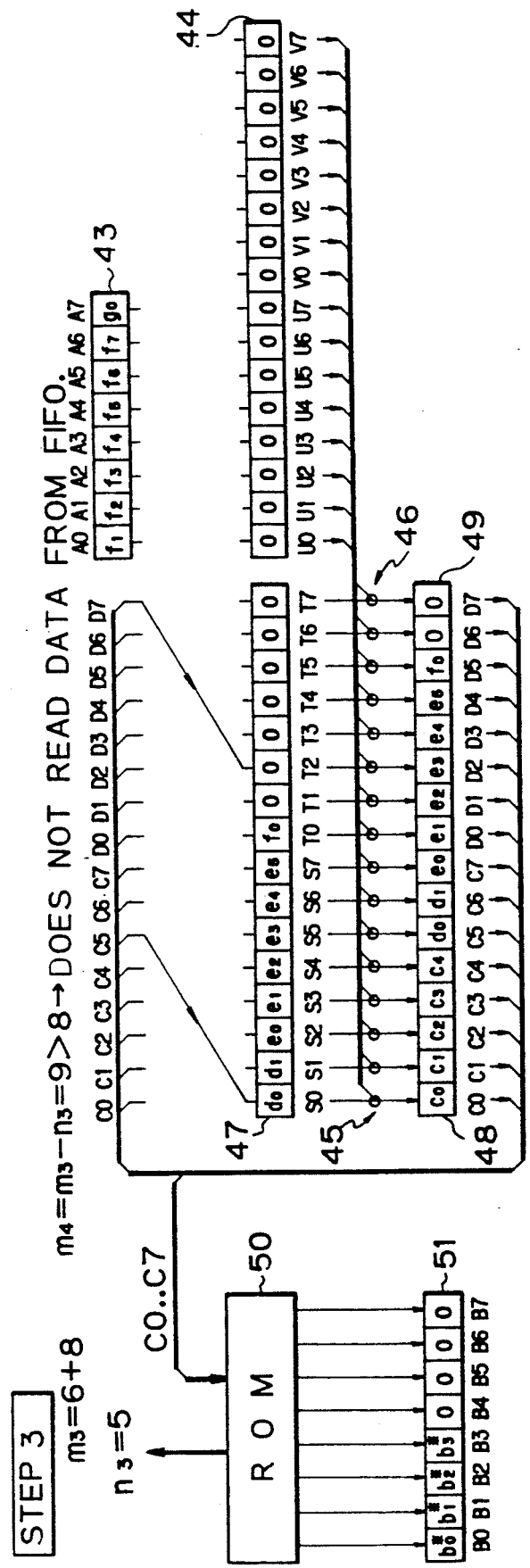

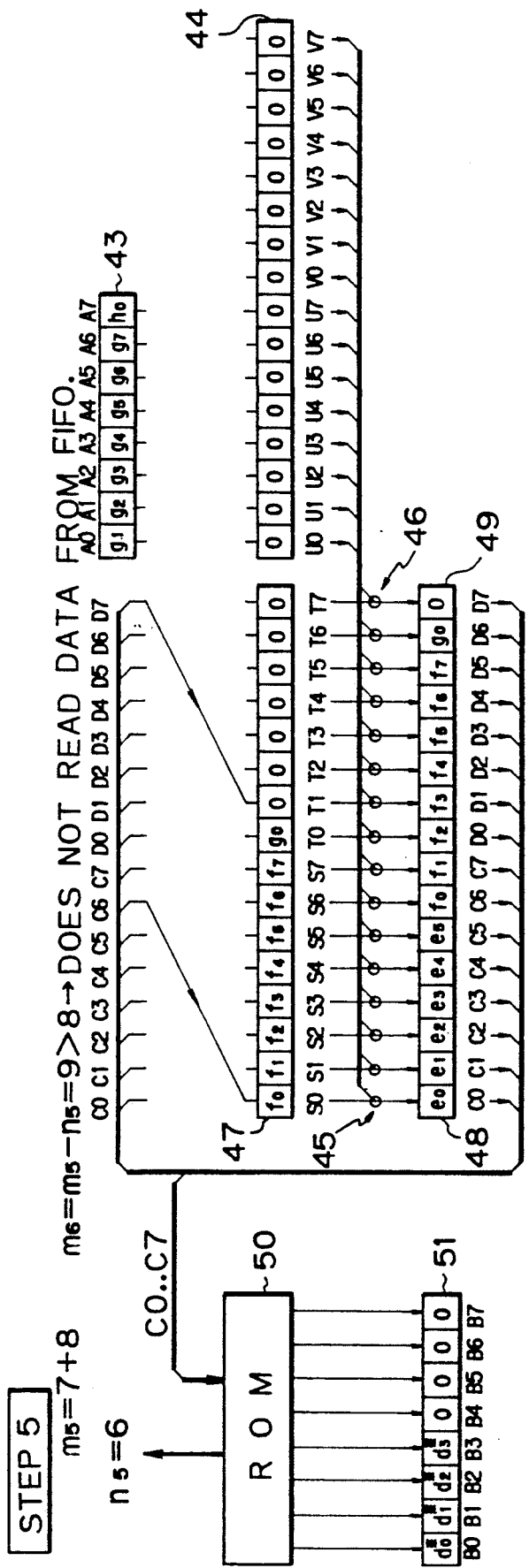

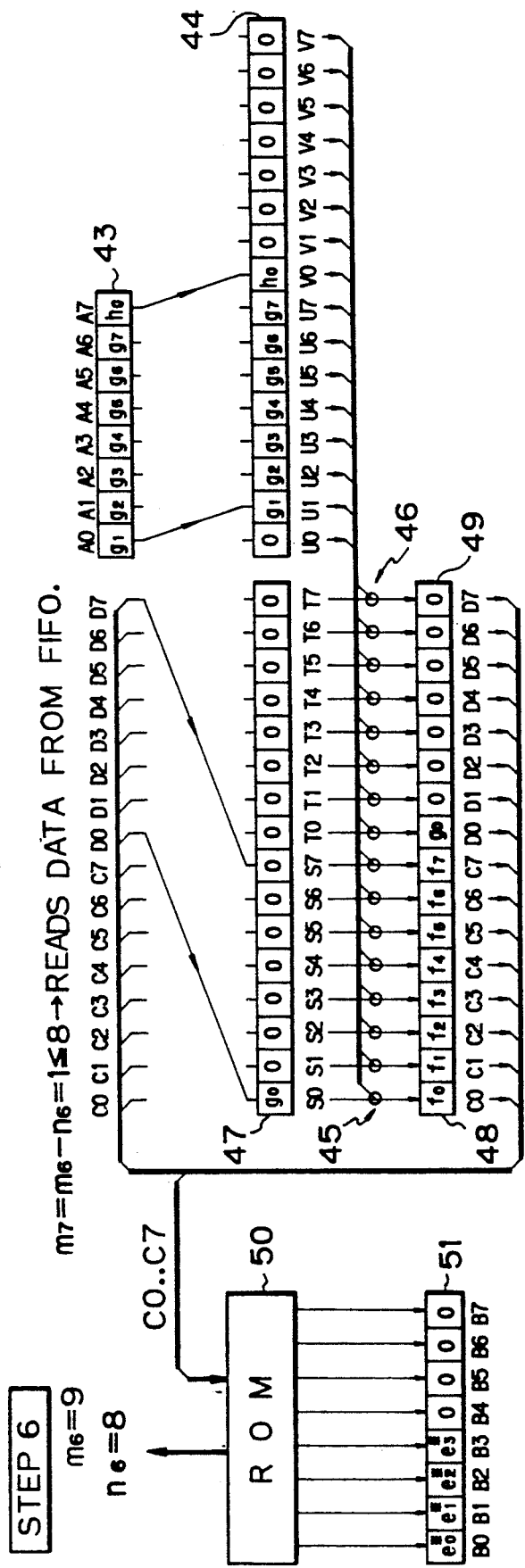

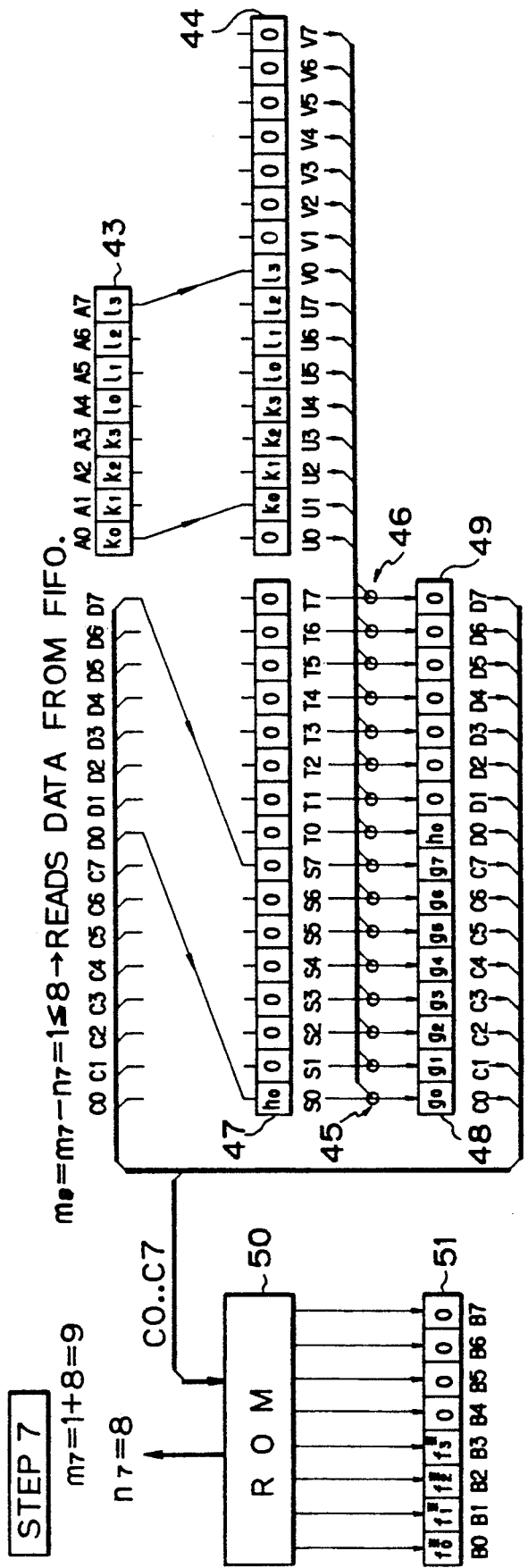

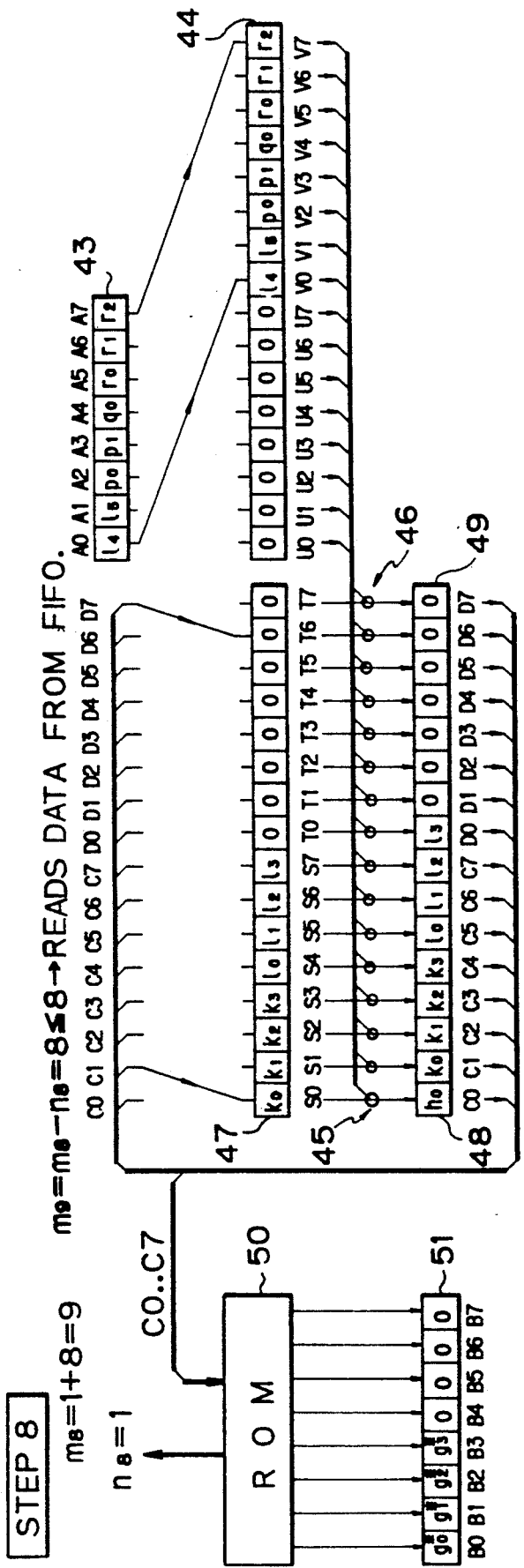

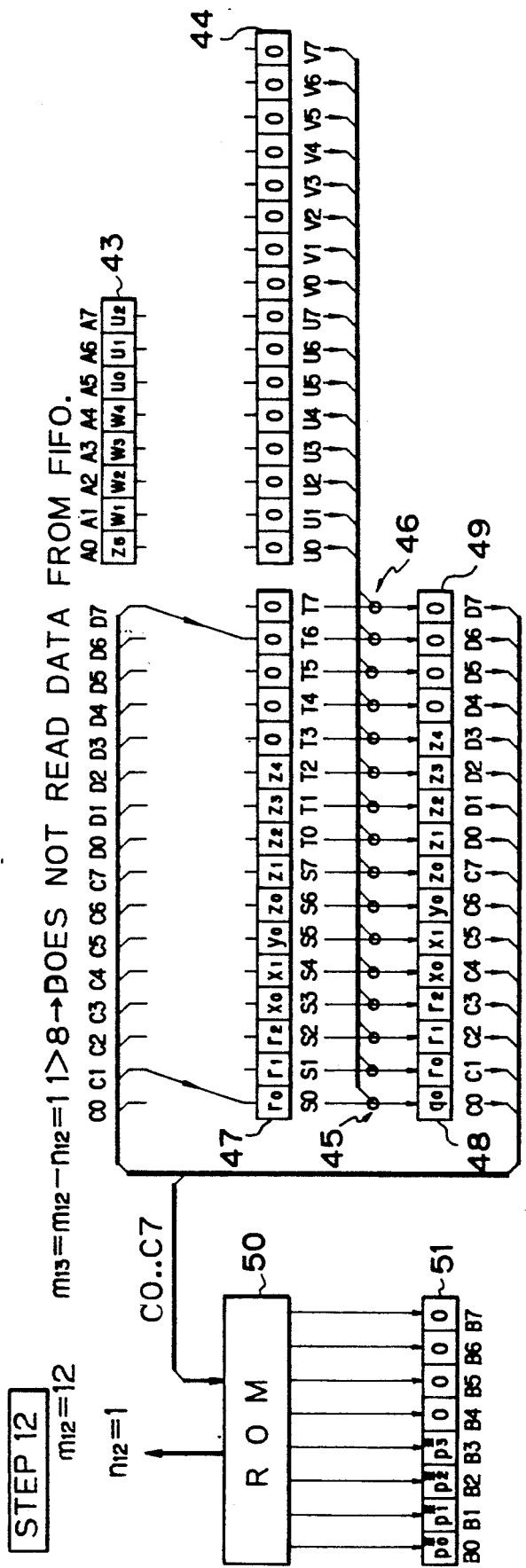

CODING AND DECODING APPARATUS OF VARIABLE LENGTH DATA

BACKGROUND OF THE INVENTION

1. Field of the Invention

The present invention relates to an encoding and decoding apparatus for encoding of data variable bit length generated with a variable bit length coding method such as a DCT (discrete cosine transform) coding method or the like into a series of data of a predetermined number of bits, and for decoding the series of data into the data of variable bit length.

2. Description of the Prior Art

As one an example of high efficiency coding methods for compressing data of digital image signals, a two-dimensional DCT discrete cosine transform (DCT) coding method has been known. The two-dimensional DCT converts a block of a digital image signal, for example, a block of $8 \times 8$ in size, into coefficient data in accordance with a particular equation so as to remove a redundant component of the digital image signal. The coefficient data is distributed two-dimensionally, that is, in the horizontal and vertical directions. In both directions, the values of low frequency components are large, while the values of the high frequency components are very small. By processing such coefficient data with a variable length coding method such as run-length Huffman encoding, the amount of data to be transferred can be significantly compressed.

Variable length data where the number of bits differs in each of the sampled data, such as data which is obtained with the Huffman coding method, is not suitable for a coding process of an error correction scheme. Such variable bit length data should be converted into data whose number of bits n is constant (for example, $n=8$). Conventionally, variable length data is converted into serial data and then the serial variable length data is observed so as to detect a delimitation of each code.

In the conventional method for processing data in the bit serial manner, when the number of bits is n, the clock frequency should be n times the sampling frequency of output data. Thus, a high speed circuit which operates at a clock frequency n times the sampling frequency is required.

OBJECTS AND SUMMARY OF THE INVENTION

Therefore, an object of the present invention is to provide a variable bit length data encoding circuit for converting data whose bit length varies into one data whose bit length is constant without the use of a high speed circuit.

Another object of the present invention is to provide a circuit for decoding data words of constant bit length into data words of the original variable bit length without the use of a high speed circuit.

According to an aspect of the present invention, there is provided an apparatus for encoding data words of variable bit length supplied at a first data rate into data words of constant bit length supplied at a second data rate, comprising:

first register means for receiving a data word of variable bit length of up to m bits at the first data rate;

shifter means for bit shifting the data word of variable bit length from the first register means in accordance with control signal, thereby forming a first shifted data word and a second shifted data word;

control signal generating means for generating the control signal in accordance with a number of bits of previously shifted data words awaiting output;

concatenating means for the first shifted data word the bits of previously shifted;

data words awaiting output, thereby forming a concatenated data word;

second register means for storing the concatenated data word, the concatenated data word being the bits of previously shifted data awaiting output with respect to a next data word of variable bit length when the concatenated data word has less than n bits;

third register means for storing the second shifted data word, the second shifted data word being the bits of previously shifted data awaiting output with respect to a next data word of variable bit length when the concatenated data word has n bits;

zero value data generating means for generating zero value data for clearing the third register means when the second shifted data word is concatenated with a next first shifted data word;

buffering means for receiving the concatenated data word from the second register means when the concatenated data word has n bits and for storing the concatenated data word as one of a plurality of data words of constant bit length; and output means for outputting the data words of constant bit length from the buffering means at the second data rate.

According to another aspect of the present invention, there is provided an apparatus for decoding data words of constant bit length into data words of variable bit length, comprising:

shifter means for shifting a data word of constant bit length by a number of bits in accordance with a control signal, thereby forming a shifted data word;

control signal generating means for generating the control signal in accordance with a number of bit of a previously output data word of variable bit length;

concatenated means for composing concatenated the shifted data word and bits of previously shifted data words awaiting decoding, thereby forming a concatenated data word; and determining means supplied with m bits of concatenated data word for determining which of the m bits correspond to a data word variable of bit length, and for outputting the data word of variable bit length and the number of bits of the data word variable bit length.

According to yet another aspect of the present invention, there is provided an apparatus for decoding data words of constant bit length as set forth above, wherein:

the control signal generating means generates the control signal based on a number which results from subtracting the number of bits of a previously output data word of variable bit length from the number of bits of the concatenated data word.

According to further aspect of the present invention, there is provided an apparatus for decoding data words of variable bit length as set forth above, wherein:

the sampled bits of previously shifted data words awaiting decoding comprise bits of a previously concatenated data word absent from a previously output data word of variable bit length.

According to a still further aspect of the present invention, there is provided an apparatus for decoding as set forth above, further comprising means for setting the shifted data words to zero value data when a number of bits of the previously shifted data words awaiting decoding data exceeds m bits.

The above, and other, objects, features and advantage of the present invention will become readily apparent from the following detailed description thereof which is to be read in conjunction with the accompanying drawings.

BRIEF DESCRIPTION OF THE DRAWINGS

FIG. 4 is a diagram showing how FIGS. 4A and 4B are to be read together;

FIGS. 4A and 4B, read together, are timing charts showing the operation of the coding apparatus; shown in FIG. 3

FIGS. 5A-5J show the contents of registers used in the coding apparatus; shown in FIG. 3, shown in FIG. 3, at sequential time intervals indicated in FIGS. 4A and 4B FIG. 6 is a schematic example of a data series;

FIG. 8 is a diagram showing how FIGS. 8A and 8B are to be read together;

FIGS. 8A and 8B, read together, are timing charts showing the operation of the decoding apparatus; shown in FIG. 7 and FIGS. 9A-9M show the data values at locations in the decoding apparatus shown in FIG. 7, at sequential time intervals indicated in FIGS. 8A and 8B.

DETAILED DESCRIPTION OF THE PREFERRED EMBODIMENTS

By referring to the accompanying drawings, embodiments of the present invention will be described in the following order:

a. Overall Structure
b. Structure of A Coding Apparatus
c. Operation of The Coding Apparatus
d. Structure of A decoding
e. Operation of The Decoding
f. Example of A Modification a. Overall Structure

Figure 1:
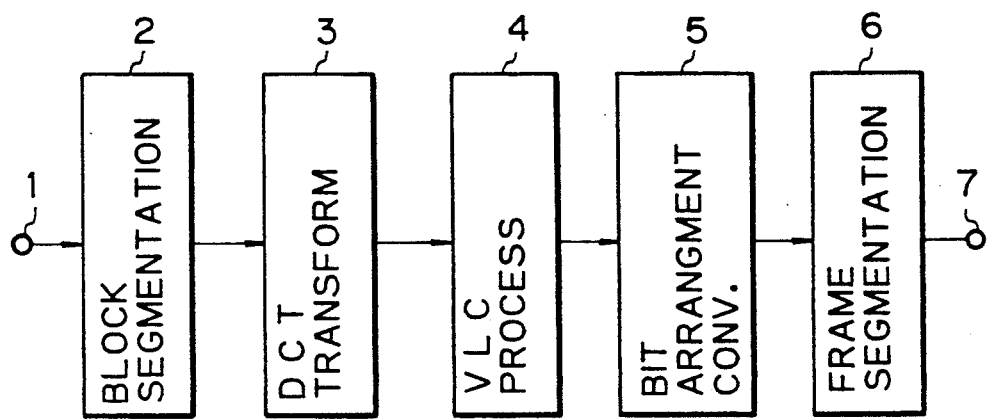
FIG. 1 is a block diagram of an encoding system in which the present invention can be applied.

FIG. 1 is a block diagram showing an overall structure of an embodiment of the present invention. A digital video signal is supplied to an input terminal whose reference numeral is 1. A block segmentation circuit 2 converts a data sequence arranged in the order of scanning lines into an ordering of blocks. An output signal of the block segmentation circuit 2 is coded by a DCT converter 3. For example, the block segmentation circuit 2 divides one frame picture into a block of (8×8). The DCT converter 3 outputs coefficient data of (8×8). The coefficient data consists of one DC component and 63 AC components. The AC components are distributed from low frequencies to high frequencies.

The coefficient data from the DCT converter 3 is supplied to a variable length coding circuit 4. The variable length coding circuit 4 encodes using a length Huffman code or the like. An output signal from the variable length coding circuit 4 is supplied to a bit arrangement converting circuit 5. The variable length data is converted into a series of data each with a constant number of bits (for example, 8 bits). An output signal from the bit arrangement converting circuit 5 is supplied to a frame segmentation circuit 6. Output data is obtained at an output terminal 7 from the frame segmentation circuit 6. The output data is transferred through a communication path. An example of the communication path is a recording apparatus comprising a rotary head and a magnetic tape.

Figure 2:
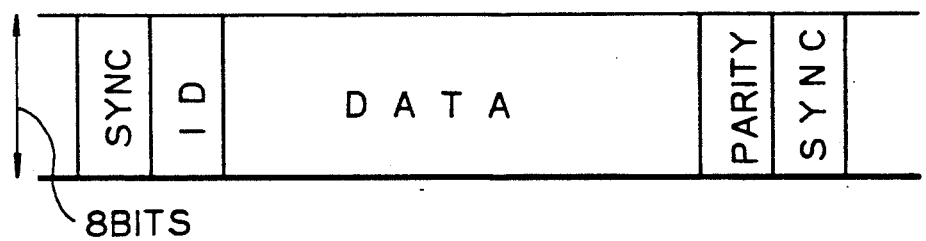
FIG. 2 is a schematic of a data transmission; format

FIG. 2 is a schematic showing an example of format for data to be transferred. The transmission data is in a byte (8 bits) serial, that is, parallel state. Synchronization data SYNC is located at the beginning of a each block of the transmission data, and is followed by identification data ID such as a block address for one synchronization block, and then coefficient data for a particular amount are present, followed by parity code data.

In contrast, as opposed to the structure shown in FIG. 1, an apparatus on the receiving side (reproducing side) (not shown) disassembles frames. The position of the first byte (word) of the data series is detected from the synchronization data SYNC or the identification data ID therein. An inverse bit arrangement converting circuit in the receiving apparatus restores the received words into variable length codes and then the receiving apparatus decodes the variable length codes into the original fixed length coefficient data.

b. Structure of A Coding Apparatus

Figure 3:
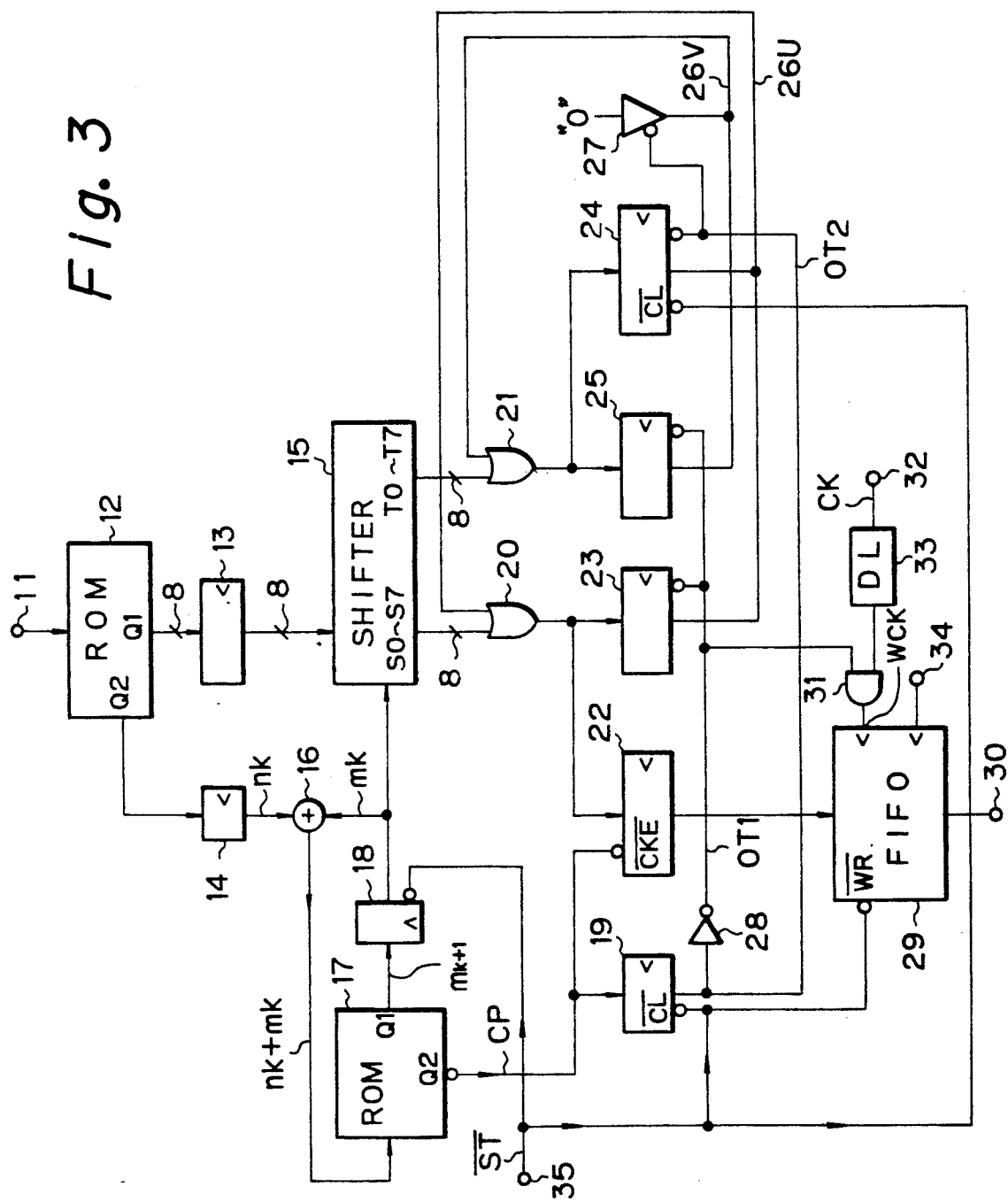
FIG. 3 is a circuit diagram of a coding apparatus.

FIG. 3 shows in detail an electrical circuit diagram for the variable length coding circuit 4 and the bit arrangement converting circuit 5 shown in FIG. 1. In FIG. 3, a sample of input data with a predetermined number of bits obtained from the DCT coding operation is supplied to an input terminal whose reference numeral is 11. Coefficient data of, for example, 9 bits, are converted into input data of, for example, 4 bits, by a re-quantization circuit. This input data is supplied to a ROM 12. The ROM 12 generates variable length data whose bit length ranges from 0 bit to 8 bits in accordance with the bit pattern of the input data. The present embodiment serves to format variable length data of 8 bits into one word of data series. The variable length data is supplied from an output terminal Q1 of the ROM 12. A control signal representing a number of significant bits in the variable length data at a time interval is generated at an output terminal Q2 of the ROM 12. The variable length data from the ROM 12 is supplied to a register 13. The control signal from the ROM 12 is supplied to a register 14. A shifter 15 is connected to the register 13. A control signal nk (where k is a sequence number of the current time interval) is supplied from the register 14 to an adder 16. An output signal (nk+mk) from the adder 16 is supplied to a ROM 17. At an output terminal Q1 of the ROM 17, a value mk+1 (which is modulo (mod.) of (nk+mk)) is generated. At an output terminal Q2, a 1-bit control signal CP is generated. The control signal CP goes low (low level) when (nk+mk)>=8. This control signal CP indicates that one word of 8 bits, resulting from concatenating the variable length data, has been written into a FIFO memory 29.

An output signal mk+1 from the ROM 17 is supplied to a register 18. A control signal mk from the register 18 is supplied to the shifter 15 and the adder 16. In addition, a control signal CP is supplied to a register 19. The shifter 15 is a circuit with a data width of 16 bits. The shifter 15 shifts the data from the register 13 to the right by a number of bits in accordance with the control signal mk. The bits which are output from the shifter 15 and which are not output from the register 13 are 0's.

Two words of 8-bit parallel data, S0 to S7 and T0 to T7 T from the shifter 15 are supplied to OR gates 20 and 21, respectively. An output signal from the OR gate 20 is supplied to registers 22 and 23. An output signal from the register 21 is supplied to registers 24 and 25. Output signals from the registers 23 and 24 are supplied to the OR gate 20 through a bus 26U. Output signals of the register 25 and a gate 27 are supplied to the OR gate 21 through a bus 26V. The gate 27 outputs 8 bits which are all 0's to the bus 26V in accordance with an output control signal OT2.

The control signal CP held in the register 19 is inverted by an inverter 28 to form an output control signal OT2 which is supplied to the registers 23 and 25. The registers 23 and 25 output the respective contents to the buses 26U and 26V when the output control signal OT1 goes low ("L"). In other words, the output control signal OT1 is a low active signal, and so should be written with a bar mark ("−") as OTL. However, to simplify the preparation of the specification, the bar mark is omitted. Likewise, for other low active signals, the bar mark is also omitted. The output control signal OT2 from the register 19 is supplied to the register 24 and the gate 27. The register 24 outputs its contents to the bus 26U when the control signal OT2 goes "L". The gate 27 outputs "0" data to the bus 26V when the control signal OT2 goes "L". The control signal CP is supplied to the register 22 as a clock enable signal. When the control signal CP goes "L", the clock signal to the register 22 is enabled and data is latched by the register 22.

An output signal from the register 22 is supplied to a FIFO memory 29. The FIFO memory 29 buffers the difference in the data rate between the 8-bit data from the register 22 and a fixed data rate at which data is supplied from the FIFO memory 29 to an output terminal 30. A write clock signal WCK is supplied to the FIFO memory 29 through an AND gate 31. The output control signal OT1 and a clock signal CK, which is supplied from an input terminal 32 through a delay circuit 33, are supplied to the AND gate 31. A read clock signal is supplied to the FIFO memory 29 from an input terminal 34 in accordance with the output data.

A start signal ST is supplied at an input terminal 35. When the start signal ST goes "L", the contents of the registers 18, 19, and 24 are cleared, the FIFO memory 29 is write-reset; and the write address is set to address 0.

c. Operation of The Coding Apparatus

Figure 4B:
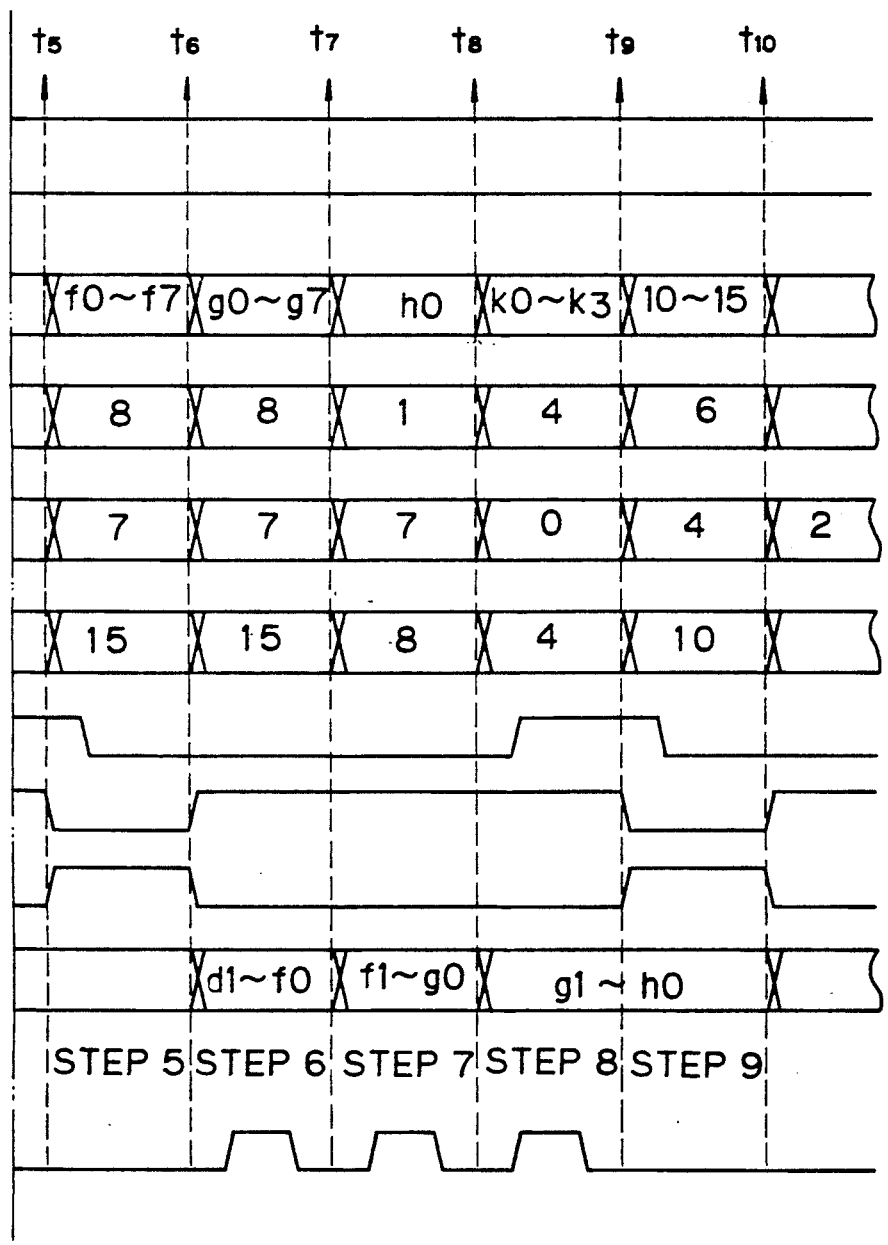
Figure 5A:
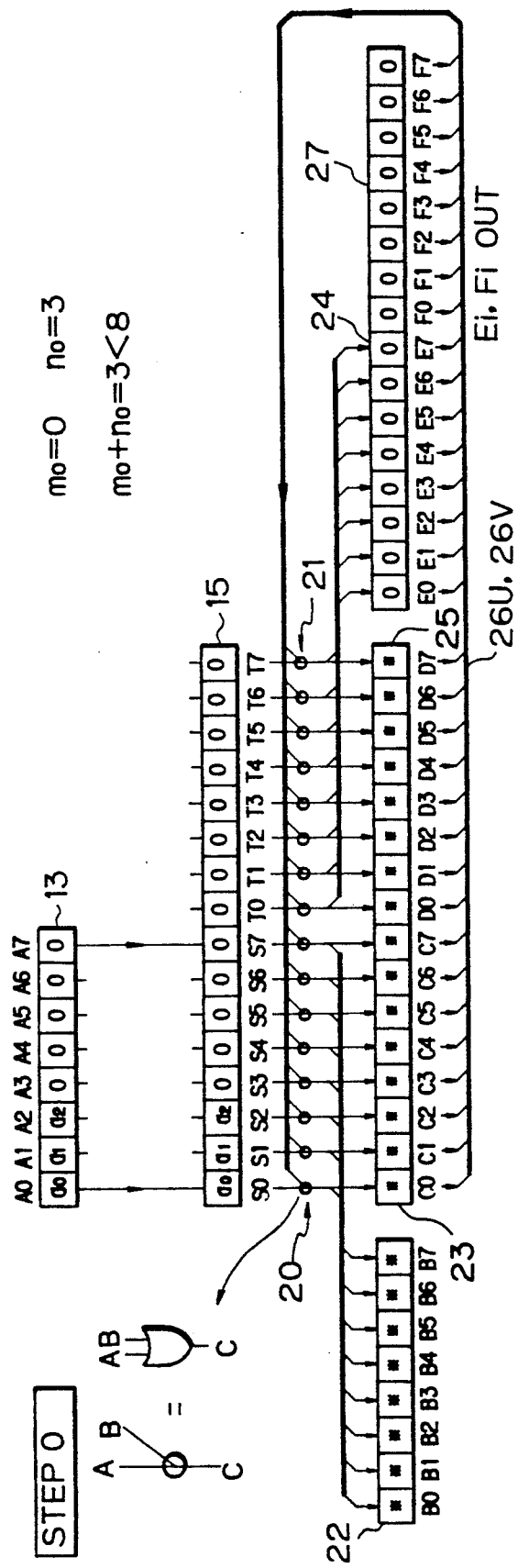
Figure 5B:
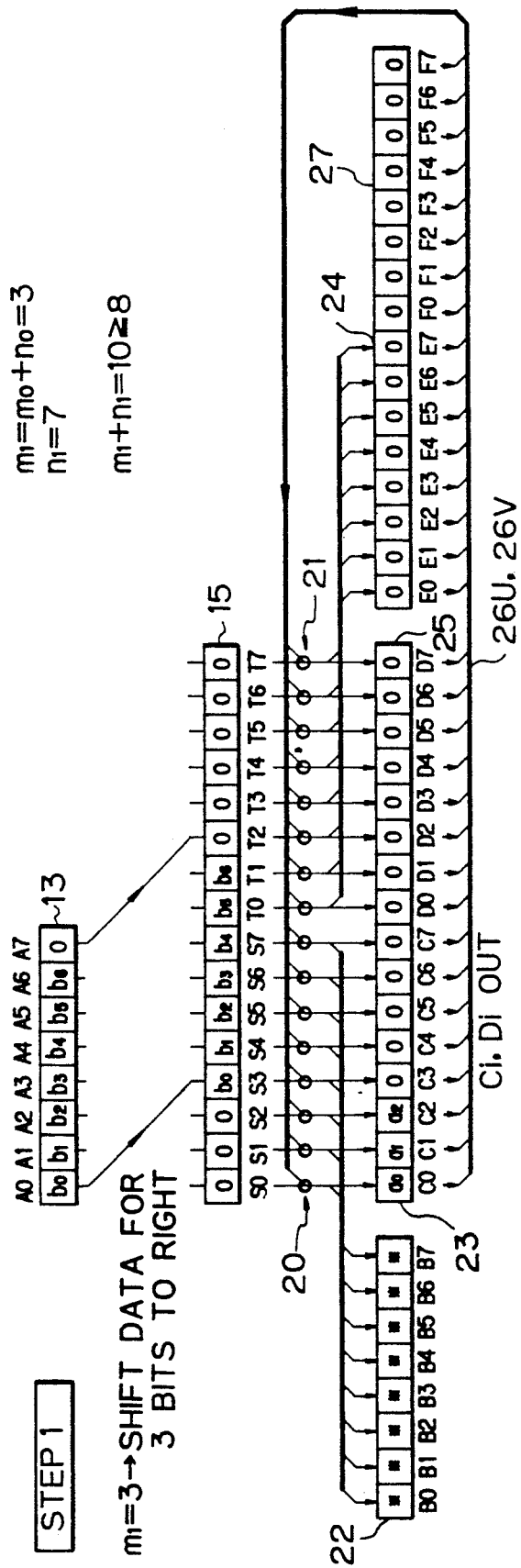

FIGS. 4A and 4B are timing charts showing operations of the structure shown in FIG. 3. FIGS. 4A and 4B show shows the clock signal CK, the start signal for data ST, the output signal A0 to A7 from the register 13 (the variable length data generated in the ROM 12), the output signal (control signal) from the register 14, the output signal (control signal) mk from the register 18, the output signal (nk+mk) of the adder 16, the control signal CP which is output from the ROM 17, the output control signal OT1, from the inverter 28 the output control signal OT2, from the register 19 the output signal for data B0 to B7 from the register 22, and the write clock signal WCK supplied to the FIFO memory 29 from the AND gate 31. The intervals defined between successive times t0, t1, . . . , t10, supplied by the clock signal CK, are referred to as step 0, step 1, . . . , step 9. The output signal from the register 13, the output signal from the shifter 15, and the output signals from the registers 22, 23, 24, and 25, and the output signal from the gate 27 at steps 0 to 9 are shown in FIGS. 5A to 5J, respectively. The data C0 to C7 are the 8-bit outputs from of the register 23. The data D0 to D7 are the 8-bit outputs from of the register 25. The data E0 to E7 are the 8-bit outputs from of the register 24. The data F0 to F7 are the 8-bit outputs from of the gate 27. As indicated in FIG. 5A, throughout FIGS. 5A-5J, the OR gates 20 and 21 are shown as circles for simplicity. The asterisks (*) in FIGS. 5A and 5B represent uncertain data.

In the step 0, beginning at the time t0, the start signal ST goes low. In response to the start signal ST, the contents of the registers 18, 19, and 24 are cleared. Consequently the control signal m0 from the register 18 becomes zero data so that the shift amount of the shifter 15 is set to 0, and the output control signals OT1 and OT2 from the inverter 28 and register 19, respectively go "H" (high level) and "L" (low level), respectively. Also, the output signal (E0 to E7), which is zero value data, from the register 24 is output to the bus 26U. The signal (F0 to F7), which is zero value data, is output to the bus 26V through the gate 27. Consequently, the data on the buses 26U and 26V has value 0. Furthermore, since the start signal ST is also supplied to the FIFO memory 29 as the write reset signal WR, the write address of the FIFO memory 29 is set to the address 0.

As shown in FIG. 5A, the output signals A0 to A7 from the register 13 are samples a0 to a2 of the first three bits of the variable length data and five zeros. The control signal signal from ROM 12 is (n0=3) and from register 18 is (m0=0). The output signal from the adder 16 is (n0+0 m0=3). The output signal the the adder 16 is supplied to the ROM 17. The modulo 8 function of the numeral 3 is 3 and so the value at the output terminal Q1 of the ROM 17 is also 3. Consequnetly, the value 3 is output from the register 18 as the control signal m1 in the subsequent step 1.

The control signal nk represents the number of significant bits of k-th interval data being output from the register 13, while the control signal mk represents the number of significant bits of data which is output in left-alignment to the busses 26U and 26V since such data has not yet been written in the FIFO memory 29.

To prevent the output data from the register 13 from colliding with data from the bus 26U and 26V at the OR gates 20 and 21, the output data from the register 13 is shifted to the right by mk bits by the shifter 15.

The data values at the step 1 are shown in FIG. 5B. Since significant bits of variable length data b0 to b6 are output from the register 13 in the step 1, the control signal n1 becomes 7. Since the shifter control signal is (m1=3), the shifter 15 shifts the data for 3 bits to the right. Thus, 3 bits (S0 to S2) of the output signal from the shifter 15 are "0"; and 5 bits (S3 to S7) and 2 bits (T0 and T1) of the output signal from the shifter 15 become are data b0 to b6. After the step 0, the data a0 to a2 was transferred to the register 23. The data a0 to a2 and the data b0 to b7 are composed, that is, concatenated by the OR gates 20 and 21 without an overlap. The output signal of the OR gate 20 is latched by the register 23 at the subsequent time t2. The output signal of the OR gate 21 is latched by the registers 24 and 25 at the time t2.

In step 1, the adder 16 generates the output signal (n1+m1=7+3=10). In step 1 the output signal m2 modulo 8 of the the ROM 17 is from 2, since 10=2 (mod. 8. On the other hand, since (10≧8), the number of significant data bits composed by the OR gates 20 and 21 in the step 1 exceeds one word or eight bits, the control signal CP goes "L" as shown in FIG. 4A at step 1, between times t1 and t2.

Figure 5C:
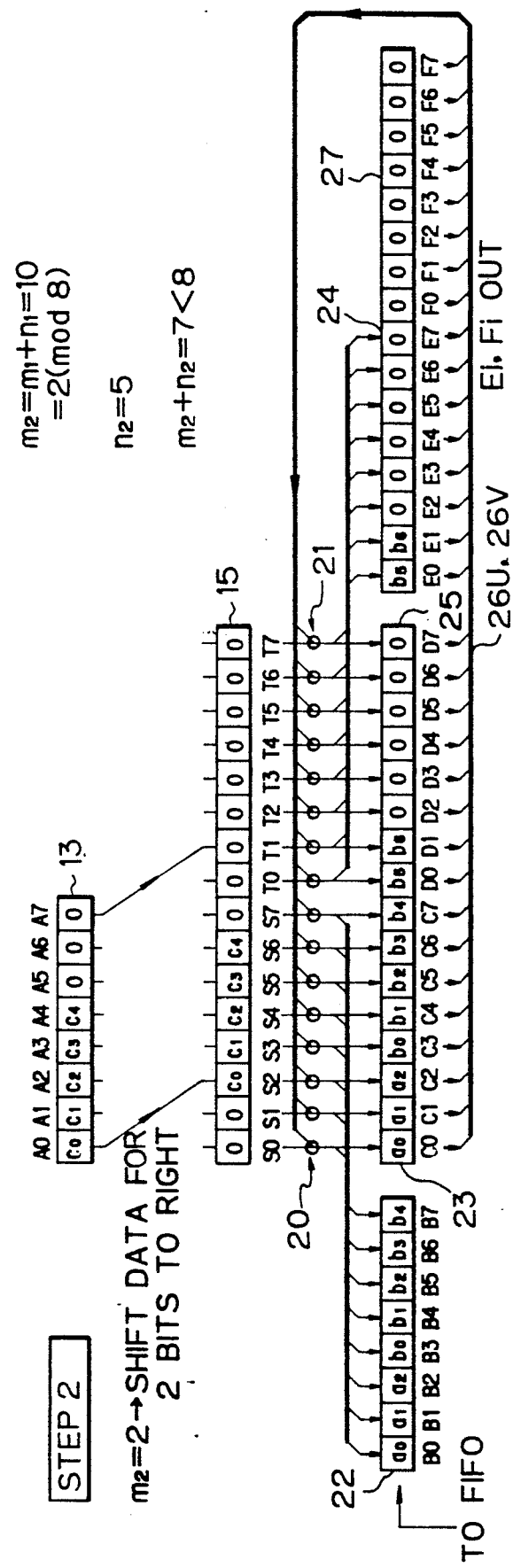
Figure 5F:
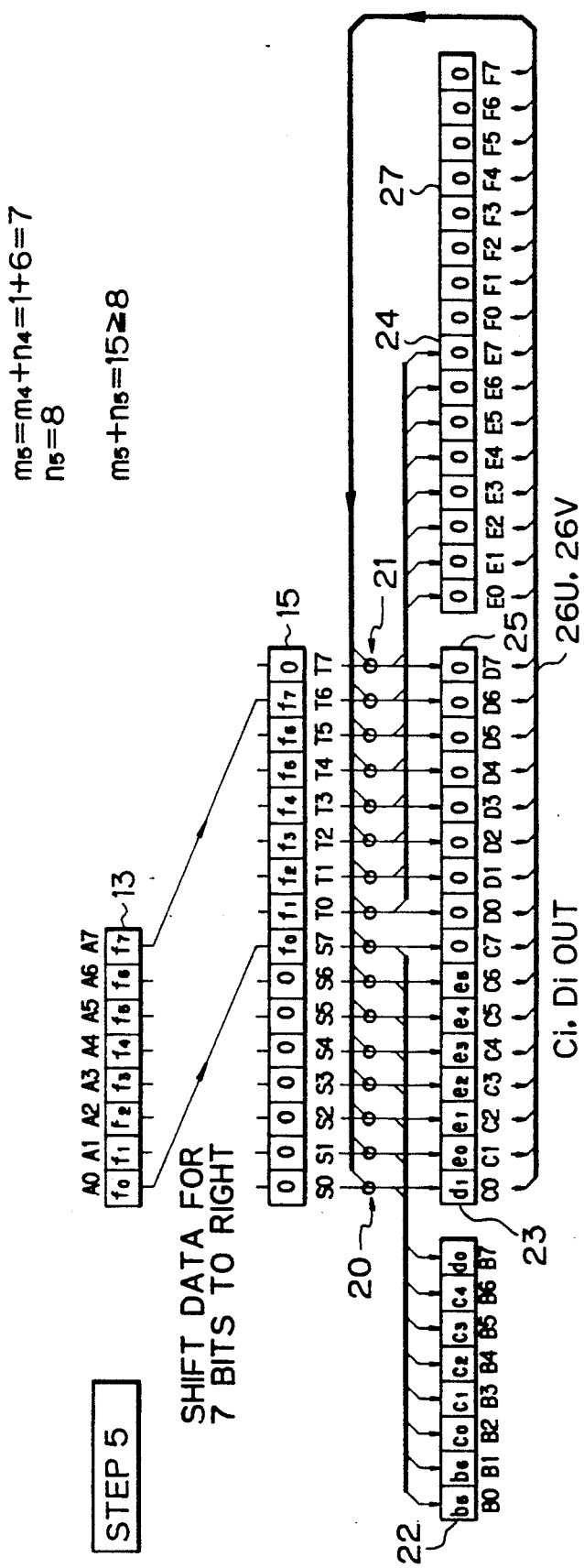
Figure 5G:
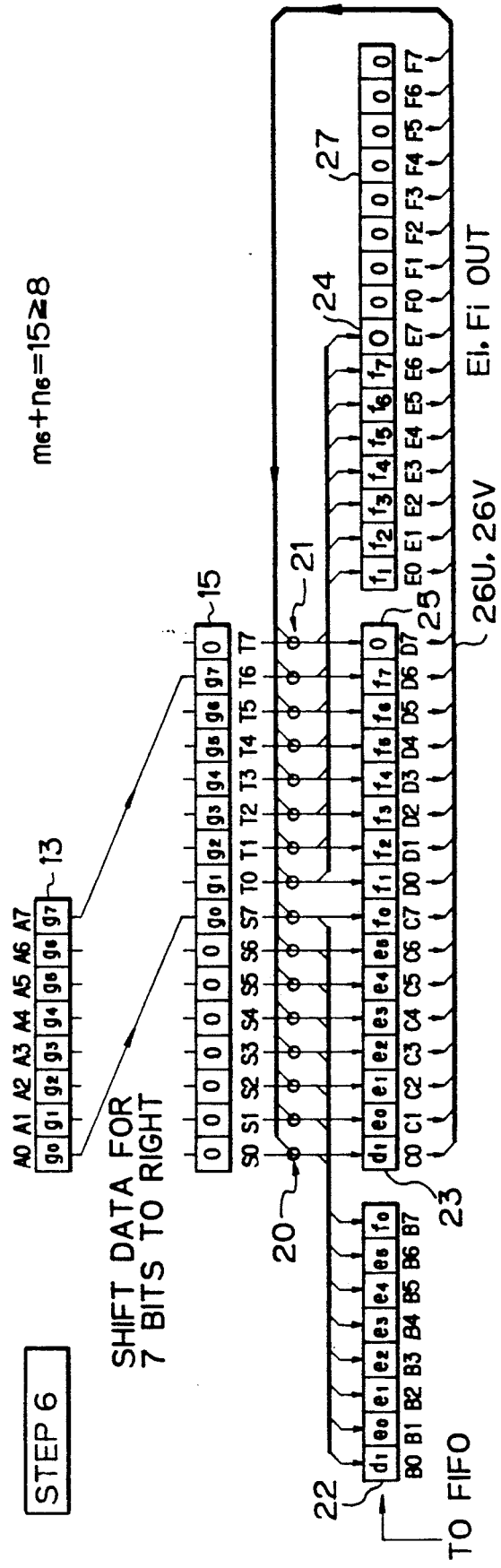
Figure 5I:
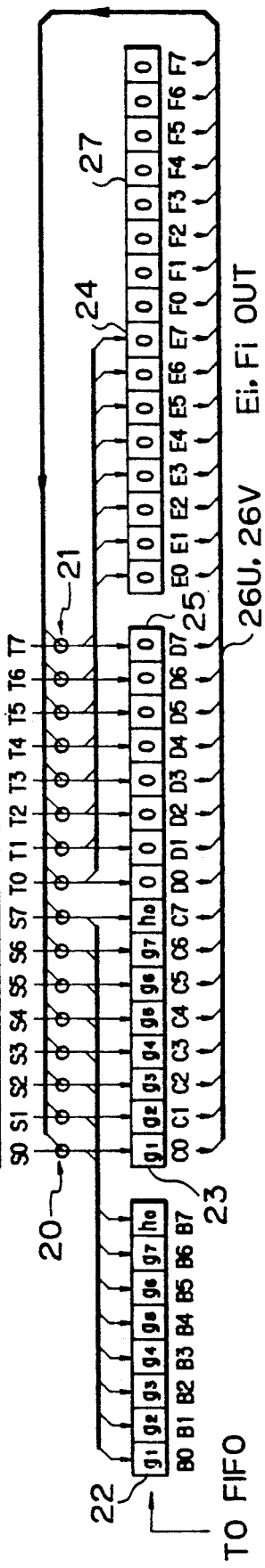

In the step 2, as shown in FIG. 5C, the subsequent 5 bits of data c0 to c4 are output from the register 13 and the control signal (n2=5) is generated. Since (m2=2), the shifter 15 shifts the data C0 to C4 2 bits to the right. The output signal (n2+m2=5+2=7) from the adder 16 is generated.

In the step 1, the control signal CP which went "L" was supplied to the register 22 as the clock enable signal. Thus, as shown in FIG. 5C, the 8 bits of the output signal (a0 to b4) from the OR gate 20 are latched by the register 22 at the time t2. In addition, since the control signal CP ("L") is latched by the register 19 at the time t2, the output control signals OT1 and OT2 go "H" and "L", respectively. Since the output control signal OT1 goes "H", the write clock signal WCK is supplied to the FIFO memory 29 through the AND gate 31. Thus, the output signal (8 bits of parallel data a0 to b4) from the register 22 is written to the address 0 of the FIFO memory 29.

In the step 2, since (OT2="L"), the output signal (b5 and b6) from the register 24 is output to the bus 26U and the output signal (zero value data) from the gate 27 is output to the bus 26V. On the other hand, since (OT1="H"), the output signal (a0 to b4) of the register 23 is not output to the bus 26U. In other words, the 8 bits of data (a0 to b4) which are written in the FIFO memory 29 are not subsequently processed and the data (b5 and b6) which has not been written in the FIFO memory 19 is output to the bus 26U for subsequent processing.

In the step 3, as shown in FIG. 5D, the subsequent 2 bits of data d0 and d1 are output from the register 13 and the control signal (n3=2) is generated. Since (m3=7), the shifter 15 shifts the data by 7 bits to the right. The adder 16 generates the output signal (n3+m3=2+7=9).

In the preceding step 2, since the control signal CP went "H", the contents of the register 22 were not changed. In addition, since the control signal CP ("H") was latched by the register 19 at time t3, in step 3 the output control signals OT1 and OT2 go "L" and "H", respectively. Since the output control signal OT1 goes "L", the write clock signal WCK is not supplied to the FIFO memory 29. Thus, the output signal from the register 22 is not written to the FIFO memory 29.

In the step 3, since (OT1="L"), the output signal (b5 to c4) from the register 23 is latched at time t3 and then output to the bus 26U, while the output signal from the register 25 (zero data latched at time t3) is output to the bus 26V.

The operations in the steps 4 to 9 which are conducted when 6 bits of data e0 to e5, 8 bits of data f0 to f7, 8 bits of data g0 to g7, 1 bit of data h0, 4 bits of data k0 to k3, and 6 bits of data l0 to l5 are latched by the register 13 are similar to those in the steps 1 to 3 above. The output signals from the registers in the steps 4 to 9 are shown in FIGS. 5E to 5J. The description of such operations is omitted for brevity.

The operation of the above embodiment is summarized as follows. When the data concatenated the OR gates 20 and 21 becomes significant data from 8 bits or more, the output signal of the OR gate 20 is latched by the register 22 and written to the FIFO memory 29. The output signal of the OR gate 21 is latched by the register 24. In 9 subsequent step, 8 bits of data with value "0" from the gate 27 and the output signal from the register 24 are output to the buses 26U and 26V, respectively. On the other hand, when data concatenated by the OR gates 20 and 21 are less than 8 bits, the output signals of the OR gates 20 and 21 are latched by the registers 23 and 25, respectively. The signals are fed back to the OR gates 20 and 21 through the buses 26U and 26V and then concatenated with the output signal from the shifter 15. This concatening operation is repeated until the output signals of the OR gates 20 and 21 exceed 8 significant bits.

According to the embodiment described above, since data encoded as variable length codes is processed as parallel data, and converted into a parallel data series where one word consists of constant number of bits (for example, 8 bits), the clock frequency of the operation is lower than that of an apparatus in which variable length codes are processed as serial data. Thus, it is possible to use a lower speed processing circuit.

d. Structure of A Decoding Apparatus

Now, an embodiment of a decoding apparatus for detecting a delimitation of each variable length code from words having a constant number of bits, such as 8 bits, and for converting each code into 4 bits of fixed data will be described.

FIG. 6 shows an example of a data series generated by the coding circuit shown in FIG. 3. The position of the first bit a0 of the first word (byte) can be detected using a synchronization signal pattern. Thus, the decoding apparatus can decode the first bit of the first word.

Figure 7:
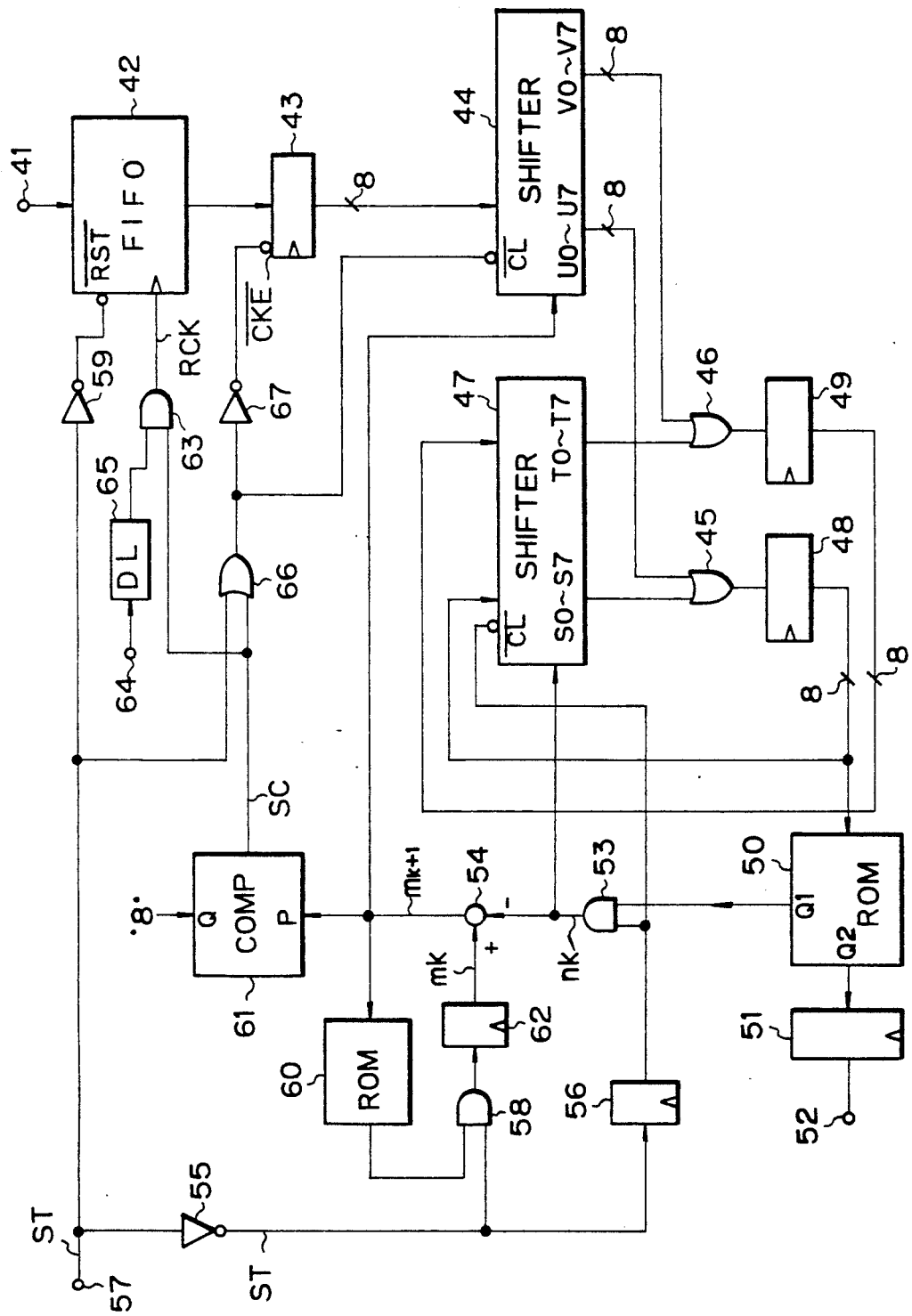
FIG. 7 is a block diagram of a decoding apparatus.

In the embodiment of the decoding circuit shown in FIG. 7, a data series such as the data series shown in FIG. 6 is supplied to an input terminal 41. Input data is written to an FIFO memory 42. Data read from the FIFO memory 42 is latched by a register 43. An output signal from the register 43 is supplied to a shifter 44. Output signals U0 to U7 and V0 to V7 from the shifter 44 are supplied to OR gates 45 and 46, respectively. Output signals S0 to S7 and T0 to T7 from another shifter 47 are supplied to the OR gates 45 and 46, respectively. An output signal from the OR gate 45 is latched by a register 48. An output signal from the OR gate 46 is latched by a register 49.

An output signal from the register 48 is fed back to an input terminal of the shifter 47 and also supplied to a ROM 50. An output signal from the register 49 is fed back to another input terminal of the shifter 47. The ROM 50 decodes variable length codes. The ROM 50 checks the variable length codes from the low order bit so as to detect a delimitation of each code. At an output terminal Q1 of the ROM 50, a control signal representing the bit length of variable length codes is obtained. In addition, by decoding the variable length codes, at an output terminal Q2 of the ROM 50, decoded data of the former 4 bit fixed length is obtained. The decoded data is obtained at an output terminal 52 through a register 51.

A control signal from the ROM 50 is supplied to an AND gate 53. A control signal nk from the AND gate 53 is supplied to the shifter 47 and a subtracter 54. The shifter 47 shifts the input data to the left by the number of bits designated by the control signal nk. An inverted start signal is supplied from a terminal 57 to the AND gate 53 and a clear terminal of the shifter 47 through an inverter 55 and a register 56. The start signal inverted by the inverter 55 is supplied to an AND gate 58. The start signal ST is supplied to the FIFO memory 42 through an inverter 59 as a read reset signal. A read address of the FIFO memory 42 is set to address 0 with the read reset signal.

An output signal mk+1 (=mk−nk) from the subtracter 54 is supplied to the shifter 44, a ROM 60, and a comparator 61. The shifter 44 shifts the input data supplied from the register 43 for mk+1 bits to the right. When the subtraction output signal mk+1 is (mk+1≦8), the ROM 60 generates a value of (mk+1+8). An output signal from the ROM 60 is supplied to the AND gate 58 along with the inverted start signal. An output signal from the AND gate 58 is supplied to a register 62. An output signal mk from the register 62 is supplied to the subtracter 54.

The value of 8 is always supplied to the comparator 61 as an input signal. When the subtraction output signal mk+1 is (mk+1≦8), the comparator 61 generates a comparison output signal SC which goes "H". This comparison output signal SC is supplied to an AND gate 63 and an OR gate 66. A word clock signal CK from a terminal 64 is supplied to the FIFO memory 42 through a delay circuit 65 and the AND gate 63 as a read clock signal RCK. Thus, when the control signal SC goes "H", the read clock signal RCK is supplied to the FIFO memory 42 and then the contents of the FIFO memory 42 are read.

An output signal from the OR gate 66, to which the comparison output signal SC from the comparator 61 and the start signal ST are supplied is supplied to the shifter 44 as a clear signal and to the register 43 through an inverter 67 as a clock enable signal. Thus, when the output signal from the OR gate 66 goes "H", the register 43 latches the output signal supplied from the FIFO memory 42.

In the decoding apparatus shown in FIG. 7, the 8 bits composed, that is, concatenated by the OR gate 45 are supplied from the register 48 to the ROM 50. By checking the 8 bits from the low order bit, a delimitation of each code can be detected and thereby each code can be decoded into the former 4-bit data. In accordance with the delimitation detected, the ROM 50 generates the control signal nk. Thus, after the nk-bit code has been decoded, nk bits of the bits stored in the register 48 become unnecessary. The remaining (8−nk) bits are to be decoded.

However, the subsequent code word may be longer than (8−nk) bits. Thus, in the subsequent step, the register 48 should contain 8 significant bits. The additional (8-(8−nk)=nk) bits of data, are provided from the OR gate 46 and the register 49. The 16 bits of data stored in the registers 48 and 49 are shifted to the left by nk bits in accordance with the control signal nk generated by the ROM 50. In other words, the unnecessary nk bits in the register 48 are discarded. In addition, when the registers 48 and 49 store mk significant bits, the nk bits are discarded in the subsequent step as was described above.

In addition, when the output signal mk+1 (=mk−nk)≦8, as a result of the shift operation by the shifter 47, the significant data is not supplied to the register 49. To prevent that, the 8 bits stored in the register 43 are shifted for mk+1 bits to the right by the shifter 44 and then the resultant data is concatenated with the output signals from the shifter 47 by the OR gates 45 and 46. Thus, the first bit of the significant data from the shifter 44 is preceded by the last bit from the shifter 47. Consequently, in the subsequent step, new significant (mk−nk+8) bits are stored in the registers 48 and 49. By repeating the aforementioned operations, the variable length codes can be continuously decoded.

e. Operation of The Decoding Apparatus

Figure 8B:
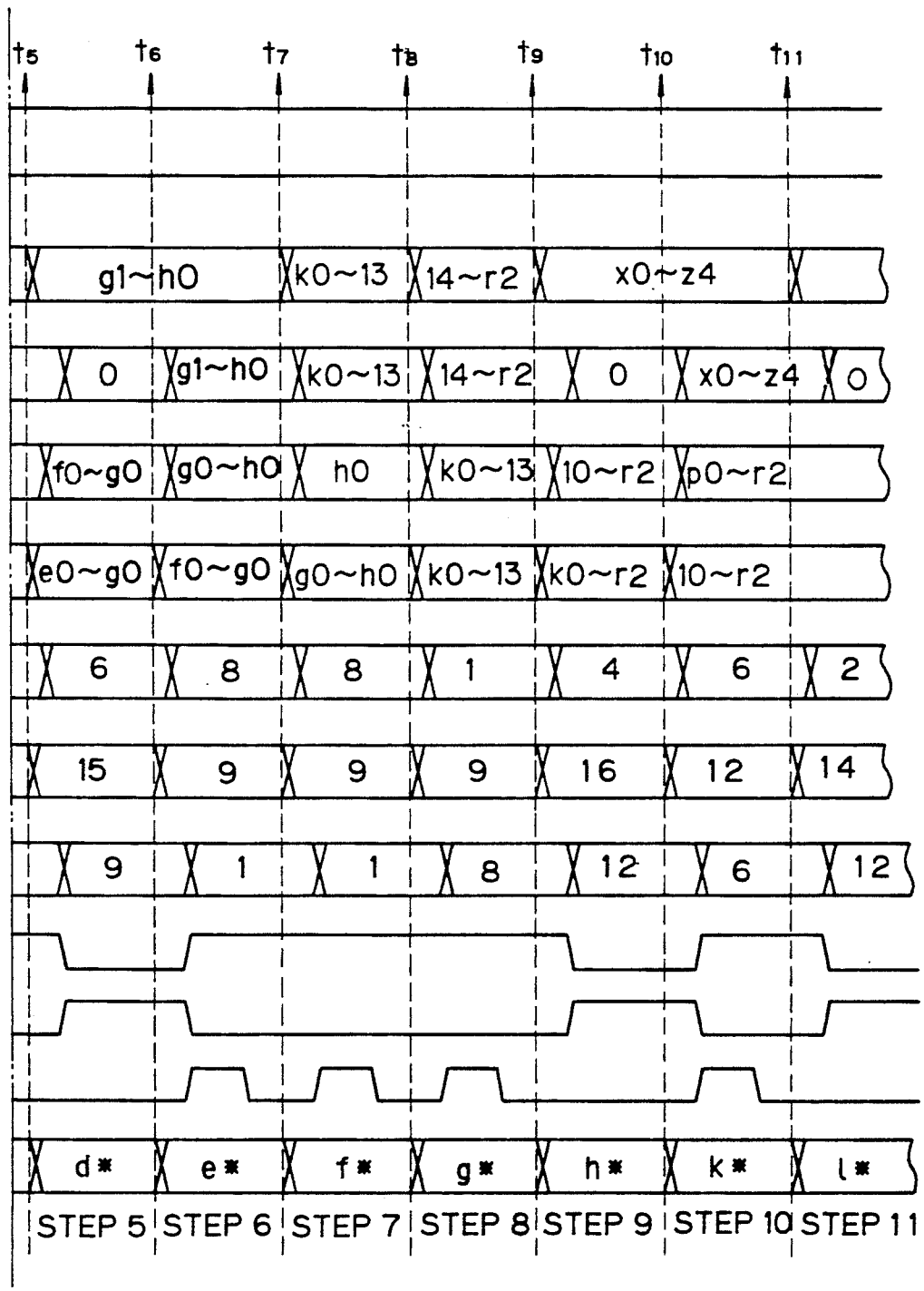

FIGS. 8A and 8B are timing charts showing operations of the structure shown in FIG. 7. FIGS. 8A and 8B shows the word clock signal CK, the start signal ST, the output signal A0 to A7 from the register 43, the output signals U0 to U7 and V0 to V7 from the shifter 44, the output signals S0 to S7 and T0 to T7 from the shifter 47, the output signals C0 to C7 and D0 to D7 from the registers 48 and 49, the control signal nk of from the AND gate 53, the output signal mk of the register 62, the output signal (mk−nk=mk+1) from the substracter 54, the comparison output signal SC from the comparator 61, the clock enable signal for the register 43 (the output signal of the inverter 67), the read clock signal RCK for the FIFO memory 42, and the output signal B0 to B7 from the register 51. The interrals defined between successive times, t0, t1, . . . , t11 supplied by the clock signal CK, are referred to as step 0, step 1, . . . , step 10. Steps 11 and 12 are similarly defined by times t12 and t13 (not shown).

The output signals from the register 43, the shifters 44 and 47, the registers 48 and 49, and the ROM 50 at steps 0 to 12 are shown in FIGS. 9A to 9M. In FIGS. 9A to 9M, the data A0 to A7 represent 8 bits output from the register 43; the data B0 to B7 represent 8 bits output from the register 51; the data C0 to C7 represent 8 bits output from the register 48; and the data D0 to D7 represent 8 bits output from the register 49. In FIGS. 9A to 9M, the OR gates 45 and 46 are represented as circles for simplicity and 4-bit length data being decoded is represented with an asterisk (*). As an example, 4 bits of data from which 3 bits of the variable length data a0 to a2 were decoded are represented as a0* to a3*.

Figure 9A:
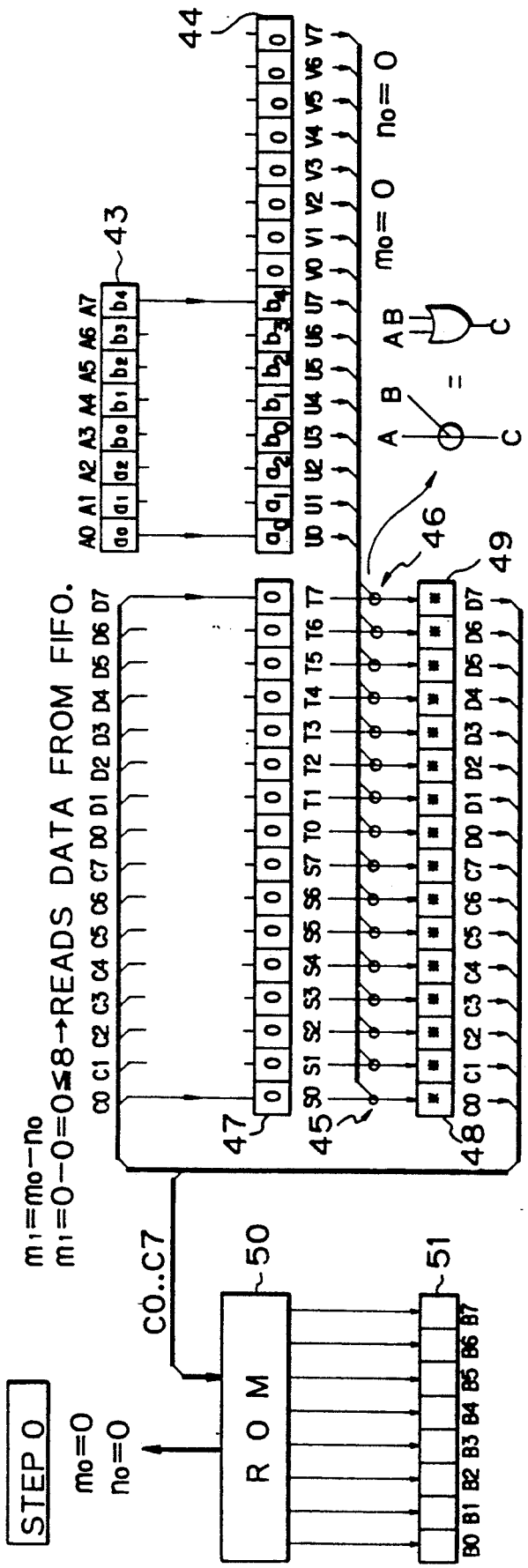

In the interval before the time t0, the start signal ST goes "H" and the inverted signal goes "L". Since the inverted start signal is supplied to the FIFO memory 42 as the read reset signal RST, the read address of the FIFO memory 42 is set to address 0. In addition, since the comparison output signal SC is at the "H" level, a first word is read from the address 0 of the FIFO memory 42. With a clock pulse at the subsequent time t0 and assuming the contents of the FIFO memory 42 are as shown in FIG. 6 (in the step 0), the first word (a0 to b4) is latched by the register 43 as shown in FIG. 9A.

In the step 0, since the output signals from the registers 56 and 62 are zero, n0 and m0 are zero and m1 is also zero. Thus, the shift amount for each of the shifters 44 and 47 is 0 zero. In addition, the output signal of from the register 56 causes the shifter 47 to be cleared, that is, all 16 bits of the output from the shifter 47 become "0" regardless of the input. Thus, the output signal from the OR gate 45 becomes (a0 to b4) and the output signal from the OR gate 46 becomes zero value data.

In addition, since m1=0, namely (m1≦8), the comparison output signal SC is "H". The read clock signal RCK from the AND gate 63 is output to the FIFO memory 42. The second word (b5 to d0) at the address 1 is read from the FIFO memory 42. Since the clock enable signal for the register 43 is at the "L" level, at a clock pulse at the subsequent time t1, the register 43 latches the second word. In addition, since (m1=0≦8), a ROM 60 generates the value starting at (0+8).

Figure 9B:
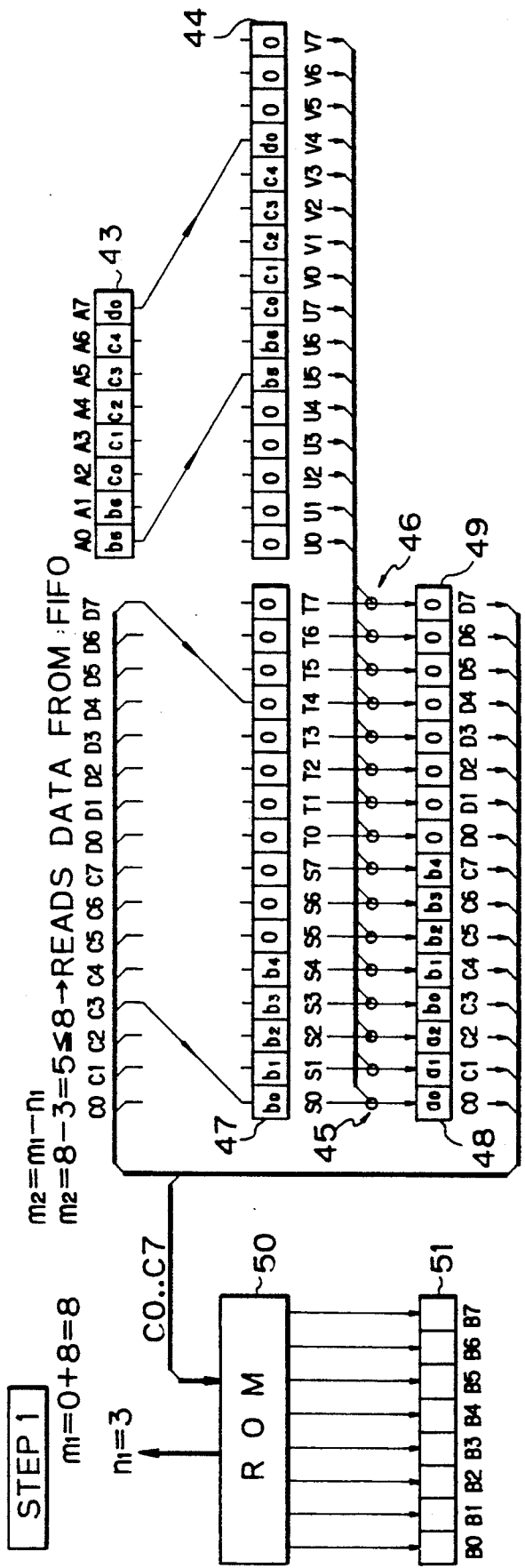
Figure 9E:
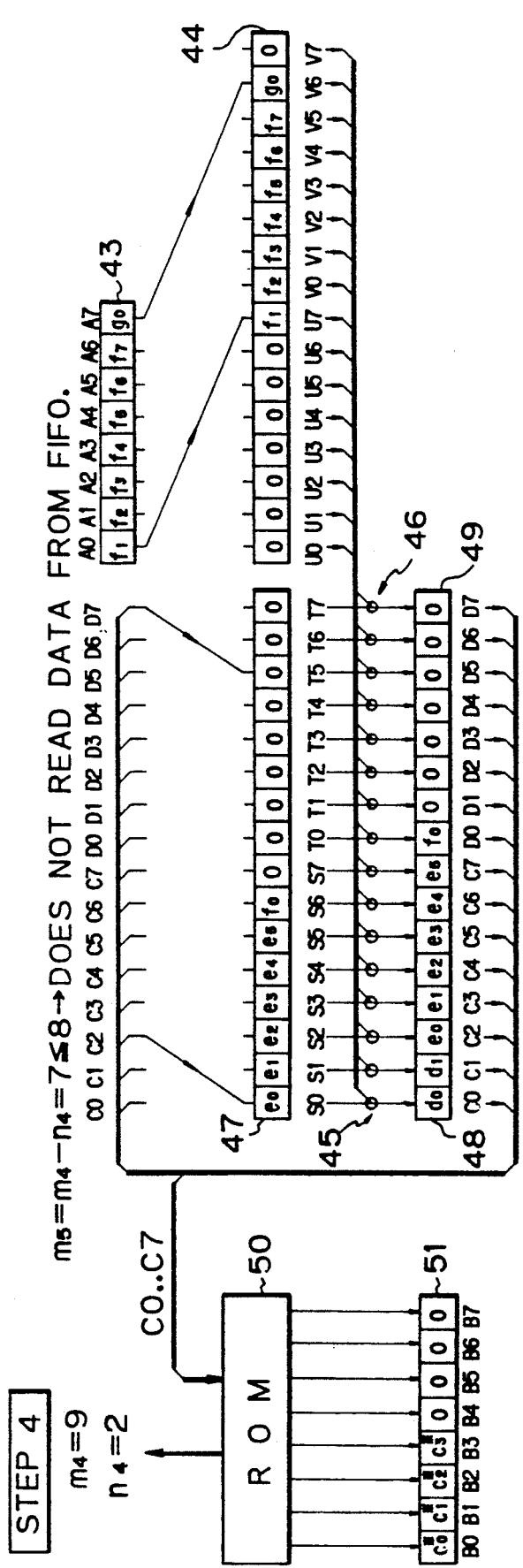
Figure 9J:
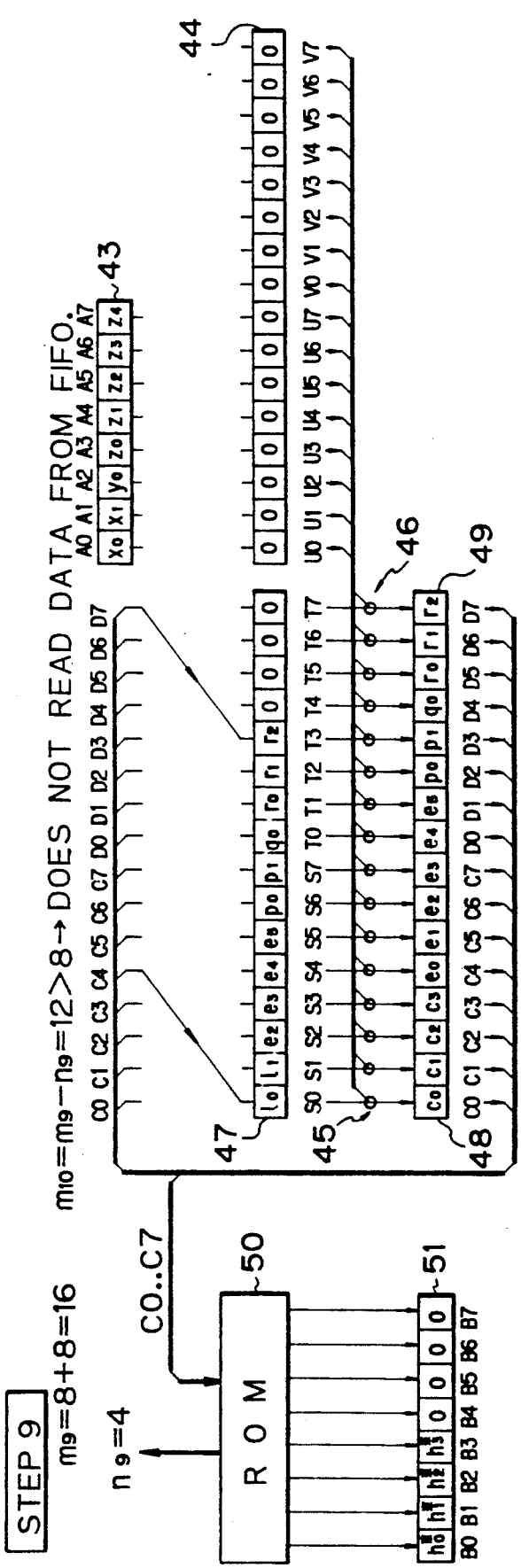
Figure 9K:
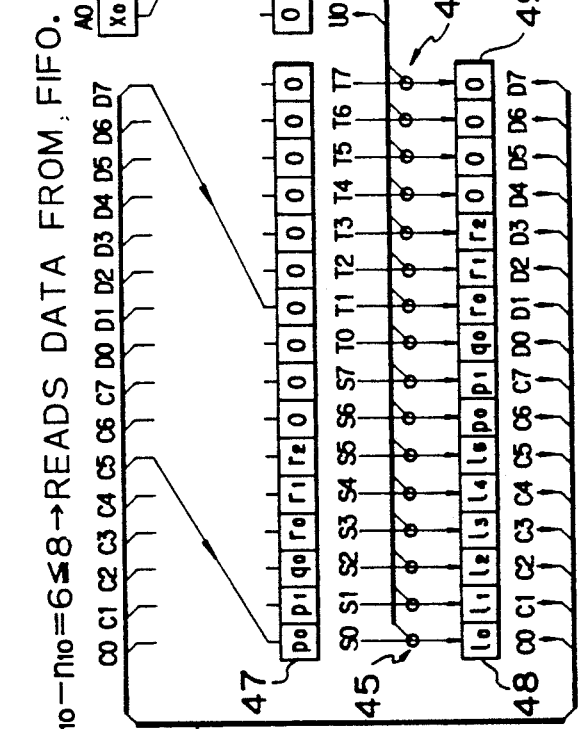
Figure 9K:
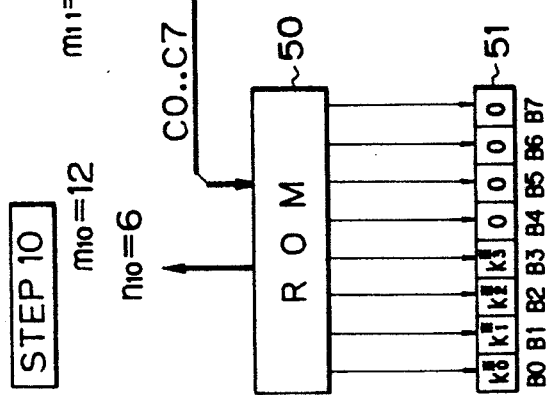
Figure 9L:
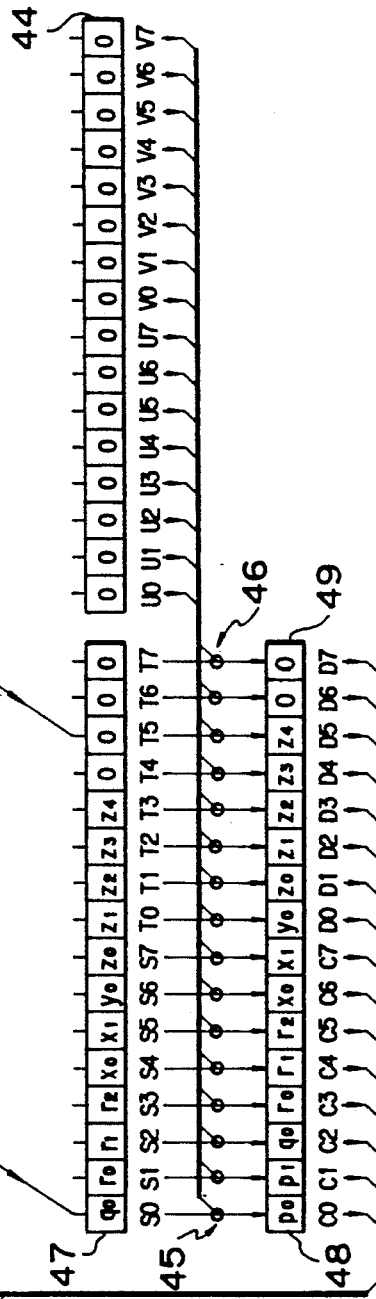

In the step 1 starting at the time t1, as shown in FIG. 9B, the output signal A0 to A7 from the register 43 is (b5 to d0); the output signal C0 to C7 from the register 48 is (a0 to b4); and the output signal D0 to D7 from the register 49 is zero value data.

The output signal from the register 48 is supplied to the ROM 50. The ROM 50 determines that the 3 bits of data (a0, a1, a2) are one code word of variable bit length data and generates 4 bits of decoded data (a0*, a1*, a2*, a3*). In addition, the ROM 50 generates a control signal of (n1=3). The 4 bits of decoded data are latched by the register 51 at a clock pulse at the subsequent time t2. Since the 3 bits (a0, a1, and a2) just decoded are not necessary in the subsequent step 2, the shifter 47 shifts its output data by 3 bits to the left and thereby the 3 bits (a0 to a2) are discarded. Then, the 5 bits (b0 to b4) are output from the left end of the shifter 47.

Since the output signal m2 of the subtracter 54 is (m1−n1=5≦8), the shifter 44 shifts its output data by 5 bits to the right. When the output from the shifter 44 is concatenated with the output from the shifter 47 by the OR gates 45 and 46, the bit b4 is followed by the bit b5. Thus, the significant 13 bits of data (b0 to d0) are output from the OR gates 45 and 46. In this case, the output signal from the ROM 60 becomes (m3=13). At a clock pulse at the subsequent time t2, these 13 significant bits are latched by the registers 48 and 49.

Since the comparison output signal SC is (m2=5≦8), the signal SC is "H". The read clock signal RCK is supplied to the FIFO memory 42 and the next word (d1 to f0) is output. The word (d1 to f0) is latched by the register 43 at a clock pulse at the subsequent time t2.

In the step 2 beginning at the time t2, as shown in FIG. 9C, the output signal A0 to A7 from the register 43 is (d1 to f0); the output signal C0 to C7 from the register 48 is (b0 f. c0) and the output signal D0 to D7 from the register 49 is (c1 to d0); and the output signal B0 to B7 from the register 51 is (a0* to a3*).

The output signal from the register 48 is supplied to the ROM 50. The ROM 50 determines that the 7 bits of data (b0 to b6) are one code word of variable bit length data and generates 4 bits of decoded data (b0* to b3*). In addition, the ROM 50 generates a control signal of (n2=7). The 4 bits of decoded data are latched by the register 51 at a clock pulse at the subsequent time t3. Since the 7 bits (b0 to b6) just decoded are unnecessary in the subsequent step 3, the shifter 47 shifts its output data by 7 bits to the left with the control signal n2, and thereby the 7 bits (b0 to b6) are discarded. The 6 bits (c0 to d0) are output from the left end of the shifter 47.

The output signal m3 from the subtracter 54 is (m2−n2=13−7=6≦8) and so the shifter 44 shifts its output data for 6 bits to the right. When the output signals from the shifter 44 are concatenated with the output signals from the shifter 47 by the OR gates 45 and 46, the bit d0 is followed by the bit d1. Thus, the significant 14 bits of data (c0 to f0) are output from the OR gates 45 and 46. In this case, the output signal from the ROM 60 becomes (m3=14). At a clock pulse at the subsequent time t3, these 14 significant bits are latched by the registers 48 and 49.

Since the comparison output signal SC is (m2=6≦8), the signal SC is "H". The read clock signal RCK is supplied to the FIFO memory 42 and then the subsequent word (f1 to g0) is output. This word (f1 to g0) is latched by the register 43 at a clock pulse at the subsequent time t3.

In the step 3 beginning at time t3, as shown in FIG. 9D, the output signal A0 to A7 from the register 43 is (f1 to g0). The output signal C0 to C7 from the register 48 and the output signal D0 to D7 from the register 49 are (c0 to e0) and (e1 to f0), respectively. The output signal B0 to B7 from the register 51 is (b0* to b3*).

The output signal from the register 48 is supplied to the ROM 50. The ROM 50 determines that the 5 of data (c0 to c4) are one code word of variable bit length data and generates 4 bits (c0* to c3*) of decoded data and the control signal (n3=5). The 4 bits of decoded data (c0* to c3*) are latched by the register 51 at a clock pulse at the subsequent time t4. Since the 5 bits (c0 to c4) just decoded are unnecessary in the subsequent step 4, the shifter 47 shifts its output data by 5 bits to the left with the control signal n3 and thereby discards the 5 bits (c0 to c4). Thus, the shifter 47 outputs the 9 bits (d0 to f0) from its left end.

In the step 3, the output signal m4 from the subtracter 54 is (m3−n3=14−5=9>8) and the comparison output signal SC goes "L", so as to clear the contents of the shifter 44. As shown in FIG. 9D, the output signal from the shifter 44 becomes zero value data regardless of its input signal. The output signal from the ROM 60 remains at 9 (without an addition of 8).

The reason why the contents of the shifter 44 are cleared is as follows. As was described above, in the registers 48 and 49, even after the 5 decoded bits are discarded, the remaining 9 bits are more than the largest number of bits of a variable bit length code word (8 bits). In the subsequent step 4, it is necessary to decode a variable length code from the 9 bits. Thus, although another word is latched by the register 43, the output signal from the shifter 44 is forced to zero value data which is used in the step 4. In addition, since the comparison output signal SC is at the "L" level, the read clock signal RCK is not supplied to the FIFO memory 42 so that data is not read from the FIFO memory 42.

The operations in the step 4 to the step 12 in which the 2 bits of data d0 and d1, the 6 bits of data e0 to e5, the 8 bits of data f0 to f7, the 8 bits of data g0 to g7, the 1 bit of data h0, the 4 bits of data k0 to k3, the 6 bits of data l0 to l5, the 2 bits of data p0 and p1, the 1 bit of data q0, the 3 bits of data r0 to r2, the 2 bits of data x0 and x1, the 1 bit of data y0, the 6 bits of data z0 to z5, and the 4 bits of data w0 to w3 are decoded are similar to the operations in the step 0 to the step 3. The various output signals from the step 4 to the step 12 are as shown in FIGS. 9E to 9M. A detailed description of such operations is omitted for brevity.

f. Example of A Modification

In the above embodiments, processing of for coefficient data generated in a DCT converter were described. However, the present embodiments may be applied in cases where variable length codes are generated by high efficiency coding processes other than DCT.

According to the present invention, data words in variable bit length is processed as parallel data. And encoded converted into parallel data with a constant bit length (for example, 8 bits) per word. In addition, data words having the constant number of bits are processed as is, namely as parallel data. Since a delimitation of each variable length code can be detected from by the variable length data rearrange as constant bit length data, each variable bit length code word can be decoded. Furthermore the clock frequency for this process is lower than the clock frequency required when data is processed serially. Thus, it is possible to use a processing circuit which operates at a lower speed.

Having described specific preferred embodiments of the present invention with reference to the accompanying drawings, it is to be understood that the invention is not limited to that precise embodiments, and that various changes and modifications may be effected therein by one skilled in the art without departing from the scope or the spirit of the invention as defined in the appended claims.

What is claimed is:

1. An apparatus for encoding data words of variable bit length supplied at a first data rate into data words of constant bit length supplied at a second data rate, comprising:

first register means for receiving a data word of variable bit length of up to m bits at said first data rate;

shifter means for bit shifting said data word of variable bit length from said first register means in accordance with a control signal, thereby forming a first shifted data word and a second shifted data word;

control signal generating means for generating said control signal in accordance with a number of bits of previously shifted data words awaiting output;

concatenating means for concatenating said first shifted data word and said bits of previously shifted data words awaiting output, thereby forming a concatenated data word;

second register means for storing said concatenated data word, said concatenated data word being said bits of previously shifted data awaiting output with respect to a next data word of variable bit length when said concatenated data word has less than n bits;

third register means for storing said second shifted data word, said second shifted data word being said bits of previously shifted data awaiting output with respect to a next data word of variable bit length when said concatenated data word has n bits;

zero value data generating means for generating zero value data for clearing said third register means when said second shifted data word is concatenated with a next first shifted data word;

buffering means for receiving said concatenated data word from said second register means when said concatenated data word has n bits and for storing said concatenated data word as one of a plurality of data words of constant bit length; and output means for outputting said data words of constant bit length from said buffering means at said second data rate.

2. An apparatus for decoding data words of constant bit length into data words of variable bit length, comprising:

shifter means for shifting a data word of constant bit length by a number of bits in accordance with a control signal, thereby forming a shifted data word;

control signal generating means for generating said control signal in accordance with a number of bits of a previously output data word of variable bit length;

concatenating means for concatenating said shifted data word and bits of previously shifted data words awaiting decoding, thereby forming a concatenated data word; and determining means supplied with m bits of said concatenated data word for determining which of said m bits correspond to a data word of variable bit length, and for outputting said data word of variable bit length and the number of bits of said data word of variable bit length.

3. An apparatus for decoding data words of constant bit length as set forth in claim 2, wherein:

said control signal generating means generates said control signal based on a number which results from subtracting said number of bits of a previously output data word of variable bit length from the number of bits of said concatenated data word.

4. An apparatus for decoding data words of constant bit length as set forth in claim 3, wherein:

said bits of previously shifted data words awaiting decoding comprise bits of a previously concatenated data word absent from a previously output data word of variable bit length.

5. An apparatus for decoding data words of constant bit length as set forth in claim 4, further comprising means for setting said shifted data word to zero value data when a number of bits of said bits of previously shifted data words awaiting decoding exceeds m bits.

* * * * *